United States Patent
Endoh

(10) Patent No.: US 9,379,205 B2
(45) Date of Patent: Jun. 28, 2016

(54) SEMICONDUCTOR DEVICE

(71) Applicant: FUJITSU LIMITED, Kawasaki-shi, Kanagawa (JP)

(72) Inventor: Akira Endoh, Machida (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/607,495

(22) Filed: Jan. 28, 2015

(65) Prior Publication Data

US 2015/0243774 A1 Aug. 27, 2015

(30) Foreign Application Priority Data

Feb. 21, 2014 (JP) .................. 2014-032085

(51) Int. Cl.
| | |
|---|---|
| H01L 29/00 | (2006.01) |
| H01L 29/66 | (2006.01) |
| H01L 29/778 | (2006.01) |
| H01L 29/43 | (2006.01) |
| H01L 29/12 | (2006.01) |
| H01L 29/207 | (2006.01) |

(52) U.S. Cl.
CPC ...... *H01L 29/66462* (2013.01); *H01L 29/7784* (2013.01); *H01L 29/7785* (2013.01); *H01L 29/122* (2013.01); *H01L 29/207* (2013.01); *H01L 29/432* (2013.01)

(58) Field of Classification Search
CPC ............ H01L 29/7783; H01L 29/66462; H01L 29/778; H01L 29/7785; H01L 29/7784; H01L 29/432; H01L 29/207; H01L 29/122
See application file for complete search history.

(56) References Cited

U.S. PATENT DOCUMENTS

| | | | | |
|---|---|---|---|---|
| 5,144,378 | A  * | 9/1992 | Hikosaka | 257/194 |
| 5,385,864 | A  * | 1/1995 | Kawasaki | H01L 21/02381 117/89 |
| 5,769,964 | A  * | 6/1998 | Charache et al. | 136/262 |
| 7,601,980 | B2 * | 10/2009 | Hudait et al. | 257/14 |
| 2008/0157058 | A1* | 7/2008 | Hudait et al. | 257/14 |
| 2013/0143038 | A1* | 6/2013 | Leuther et al. | 428/332 |
| 2014/0264278 | A1* | 9/2014 | Bennett et al. | 257/24 |

FOREIGN PATENT DOCUMENTS

| | | |
|---|---|---|
| JP | H02-246342 | 10/1990 |
| JP | 2007-81103 A1 | 3/2007 |

OTHER PUBLICATIONS

Indium WebElements (undated).*
E.-Y. Chang, et al.; "InAs Thin-Channel High-Electron-Mobility Transistors with Very High Current-Gain Cutoff Frequency for Emerging Submillimeter-Wave Applications;" Applied Physics Express 6; 2013; pp. 034001-1-034001-3 and cover sheet (4 Sheets)/ pp. 1-2 of specification.

* cited by examiner

*Primary Examiner* — Nikolay Yushin
(74) *Attorney, Agent, or Firm* — Kratz, Quintos & Hanson, LLP

(57) ABSTRACT

A semiconductor device includes: a semiconductor multi-layer structure which includes at least an electron traveling layer and an electron supply layer on a substrate, wherein the electron supply layer includes a first portion which contains Sb and has at least a portion doped with Te, and a second portion which is located closer to the electron traveling layer side than the first portion and has a lattice constant smaller than that of the first portion.

11 Claims, 23 Drawing Sheets

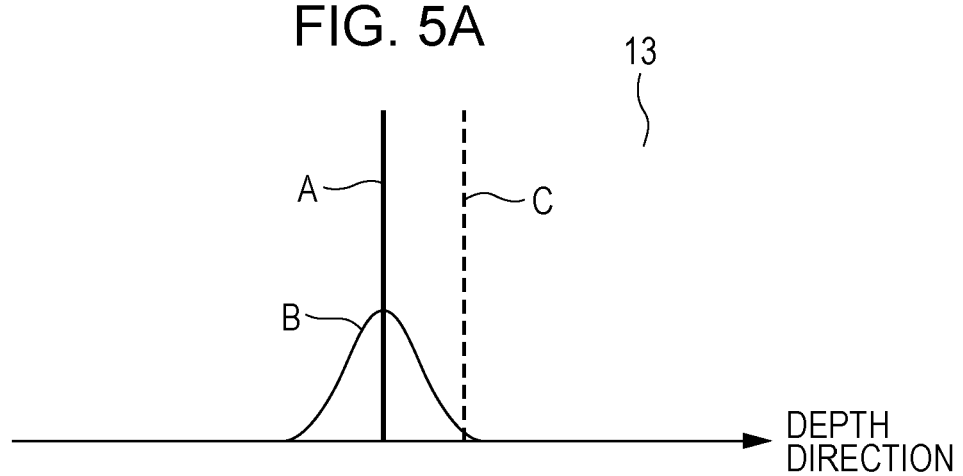
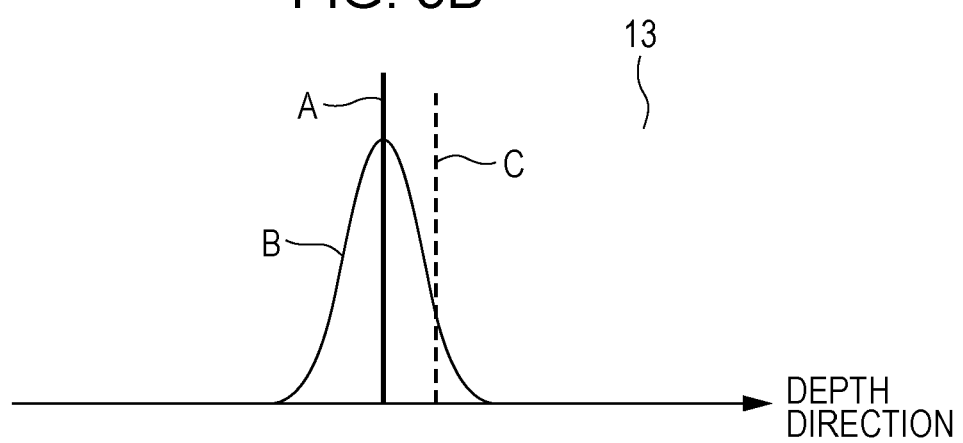

SEMICONDUCTOR DEVICE

CROSS-REFERENCE TO RELATED APPLICATION

This application is based upon and claims the benefit of priority of the prior Japanese Patent Application No. 2014-032085 filed on Feb. 21, 2014, the entire contents of which are incorporated herein by reference.

FIELD

The embodiment discussed herein is related to a semiconductor device.

BACKGROUND

One of ultrafast communication transistors operable in, for example, a millimeter-wave band (approximately 30 GHz to approximately 300 GHz) or a submillimeter-wave band (approximately 300 GHz to approximately 3 THz) is an InP-based high electron mobility transistor (HEMT) which uses a Group III-V compound semiconductor.

The InP-based HEMT has a basic structure in which InGaAs is used for an electron traveling layer (channel layer) and InAlAs is used for an electron supply layer (barrier layer). Here, an $In_{0.53}Ga_{0.47}As$ channel layer lattice-matched to an InP substrate, a pseudo-lattice-matched group channel layer in which an InAs composition in an InGaAs channel layer is increased to approximately 0.7 to approximately 0.8 in order to increase high speed performance, a composite channel layer including an InAs ultrathin layer in an InGaAs layer, and the like are used as the channel layer.

The current world's fastest field effect transistor is an $In_{0.7}Ga_{0.3}As/InAs/In_{0.3}Ga_{0.3}As$ composite channel HEMT, and a cut-off frequency $f_T$ thereof is approximately 710 GHz.

Japanese Laid-open Patent Publication No. 2007-81103 and Japanese Laid-open Patent Publication No. 2-246342 are examples of related art.

E.-Y. Chang et al., "InAs Thin-Channel High-Electron-Mobility Transistors with Very High Current-Gain Cutoff Frequency for Emerging Submillimeter-Wave Applications", Applied Physics Express 6, 034001 (2013) is also an example of related art.

Incidentally, a cut-off frequency $f_T$ which is one of the criteria for the high speed performance of HEMT is expressed by the following expression.

$$f_T = \frac{1}{2\pi\left(\frac{L_g}{v} + \tau_{ex}\right)}$$

Here, $L_g$ denotes a gate length, v denotes electron velocity under a gate electrode, and $\tau_{ex}$ denotes a parasitic delay time.

The high speed performance of an HEMT is mainly realized by a reduction in the size of the gate length $L_g$ and an increase in the electron velocity v caused by a semiconductor material, having a small effective mass of electrons, which is used for a channel. The reduction in the size of the gate length and the increase in the electron velocity are equivalent to a reduction in an intrinsic delay time of the HEMT. At present, the size of the gate length $L_g$ has been being reduced in order to realize the high speed performance of the HEMT.

When the size of the gate length $L_g$ is reduced, a distance between a gate and a channel is also reduced from the viewpoint of scaling. For this reason, a barrier layer is thinned.

On the other hand, the barrier layer is δ-doped with Si as a source for supplying electrons to a channel layer. In this case, when the barrier layer is thinned, the amount of electrons supplied to the channel layer is decreased. For this reason, sheet resistance is reduced, and thus an Si δ-doping amount is increased, thereby increasing the concentration thereof.

In the above-mentioned InP-based HEMT, Si with which the δ-doping is performed widely diffuses to an InAlAs barrier layer and diffuses to an InGaAs channel layer in some cases in accordance with the reduction in the thickness of the barrier layer and the high concentration Si δ-doping.

In this manner, when Si diffuses into the channel layer in accordance with the reduction in the thickness of the barrier layer and the high concentration Si δ-doping, electron velocity and electron mobility in the channel layer are reduced due to the ionized impurity scattering of Si which diffuses into the channel layer. This phenomenon is a negative factor in realizing the high speed performance of the HEMI.

SUMMARY

According to an aspect of the invention, a semiconductor device includes: a semiconductor multi-layer structure which includes at least an electron traveling layer and an electron supply layer on a substrate, wherein the electron supply layer includes a first portion which contains Sb and has at least a portion doped with Te, and a second portion which is located closer to the electron traveling layer side than the first portion and has a lattice constant smaller than that of the first portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 5A and 5B are diagrams illustrating a problem of the present disclosure;

DESCRIPTION OF EMBODIMENT

Hereinafter, a semiconductor device according to an embodiment of the present disclosure will be described with reference to FIGS. 1 to 23.

The semiconductor device according to this embodiment includes, for example, an InP-based HEMT which is one of ultrafast transistors used for communication. In other words, for example, the semiconductor device includes an InP-based HEMT having a semiconductor multi-layer structure using an InAlAs/InGaAs-based compound semiconductor on an InP substrate. The InP-based HEMT is a transistor operable, for example, in a millimeter-wave (approximately 30 GHz to approximately 300 GHz) region or a submillimeter-wave (approximately 300 GHz to approximately 3 THz) region. Meanwhile, the InAlAs/InGaAs-based compound semiconductor is also referred to as a Group III-V compound semiconductor. In addition, the InP-based HEMT is also referred to as an InAlAs/InGaAs-based HEMT.

Figure 1:
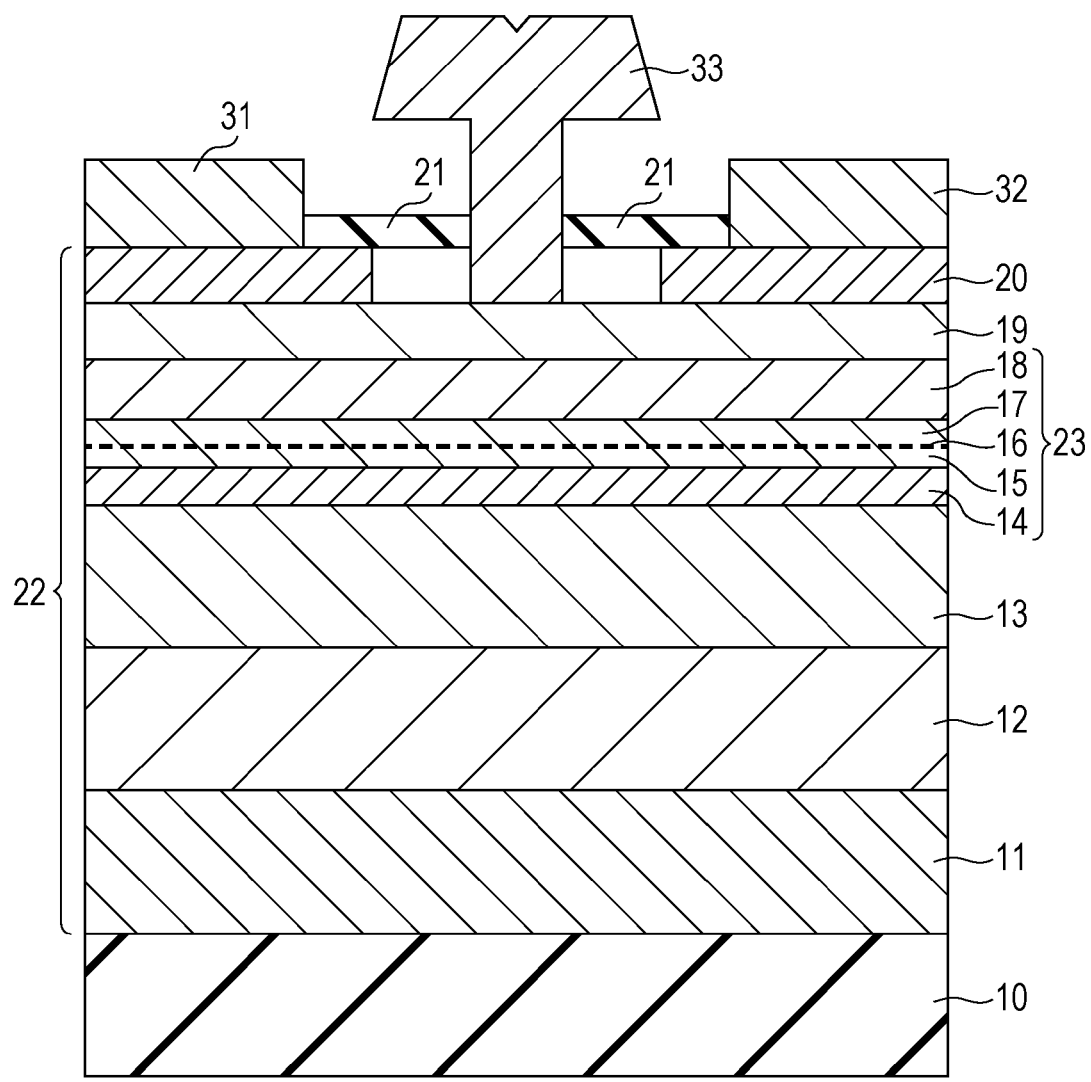
FIG. 1 is a schematic cross-sectional view illustrating the configuration of a semiconductor device (InAlAs/InGaAs-based HEMT; InP-based HEMT) according to this embodiment.

As illustrated in FIG. 1, the InP-based HEMT includes a substrate 10, a semiconductor multi-layer structure 22 provided on the substrate 10, and a gate electrode 33, a source electrode 31, and a drain electrode 32 which are provided on the semiconductor multi-layer structure 22.

In this embodiment, the substrate 10 is a semi-insulating InP substrate (for example, a semi-insulating (100) InP substrate; a semiconductor substrate). Meanwhile, a GaAs substrate or an Si substrate may also be used as the substrate 10.

The semiconductor multi-layer structure 22 is a semiconductor multi-layer structure including an electron traveling layer 13 and an electron supply layer 23. Here, the semiconductor multi-layer structure 22 has a structure in which a buffer layer 11, a lower barrier layer 12, an electron traveling layer (channel layer) 13, an electron supply layer (upper barrier layer) 23, an etching stop layer 19, and a cap layer 20 are sequentially stacked.

In this embodiment, the buffer layer 11 has a thickness of, for example, approximately 1000 nm. Meanwhile, a material used for the buffer layer 11 varies according to the substrate 10.

The lower barrier layer 12 is an InAlAs layer. Here, the lower barrier layer is an undoped InAlAs layer. For example, the lower barrier layer is an i-$In_{0.52}Al_{0.48}As$ layer and has a thickness of approximately 200 nm.

The electron traveling layer 13 is an InGaAs layer. In other words, the electron traveling layer 13 includes InGaAs. Here, the electron traveling layer is an undoped InGaAs layer. For example, the electron traveling layer is an i-$In_{0.53}Ga_{0.47}As$ layer and has a thickness of approximately 10 nm. Meanwhile, the electron traveling layer 13 may not be an $In_{0.53}Ga_{0.47}As$ layer which is lattice-matched to InP, and may have an InAs composition higher than 0.53 such as an $In_{0.7}Ga_{0.3}As$ layer to which compression strain is applied.

The electron supply layer 23 has a structure in which an InAlAs spacer layer 14, an AlSb layer 15, a Te δ-doping layer 16, an AlSb layer 17, and an InAlAs barrier layer 18 are sequentially stacked. Here, the electron supply layer 23 has a structure in which the undoped InAlAs spacer layer 14, the undoped AlSb layer 15, the Te δ-doping layer 16 which is doped with Te as impurity atoms serving as an electron supply source (source for supplying channel electrons), the undoped AlSb layer 17, and the undoped InAlAs barrier layer 18 are sequentially stacked. For example, the electron supply layer 23 has a structure in which the i-$In_{0.52}Al_{0.48}As$ spacer layer 14 having a thickness of approximately 2 nm, the i-AlSb layer 15 having a thickness of approximately 0.6 nm, the Te δ-doping layer (high concentration Te δ-doping layer) 16 in which a δ-doping amount of Te is set to approximately $1 \times 10^{13}$ $cm^{-2}$, the i-AlSb layer 17 having a thickness of approximately 0.6 nm, and the i-$In_{0.52}Al_{0.48}As$ barrier layer 18 having a thickness of approximately 3 nm are sequentially stacked.

In other words, in the InP-based HEMT having a semiconductor multi-layer structure using an InAlAs/InGaAs-based compound semiconductor, the AlSb layers 15 and 17 are provided in the electron supply layer 23 using InAlAs, and the AlSb layers 15 and 17 are δ-doped with Te as impurity atoms serving as an electron supply source, instead of using InAlAs for the electron supply layer and performing Si δ-doping on the electron supply layer.

In particular, when the size of a gate length $L_g$ is reduced in order to realize the high speed performance of the HEMT, the InAlAs electron supply layers 14 and 18 are thinned, the AlSb layers 15 and 17 which are ultrathin layers are provided in the InAlAs electron supply layers, and the AlSb layers 15 and 17 are δ-doped with Te as impurity atoms serving as an electron supply source at a high concentration, instead of thinning an InAlAs electron supply layer and performing Si δ-doping at a high concentration.

Here, the AlSb layers 15 and 17 interposed between the InAlAs spacer layer 14 and the InAlAs barrier layer 18 are ultrathin layers having a thickness corresponding to, for example, substantially two atomic layers. For this reason, even when the AlSb layers 15 and 17 are provided, an influence exerted on ohmic resistance is small. In addition, the Te δ-doping layer 16 is an ultrathin layer which is provided between the AlSb layers 15 and 17 as ultrathin layers having a thickness corresponding to, for example, two atomic layers and which has a thickness of, for example, equal to or less than one atomic layer. The Te δ-doping layer 16 is an ultrathin layer which is formed by performing Te δ-doping on the AlSb layers 15 and 17 as ultrathin layers having a thickness corresponding to two of upper and lower atomic layers and which has a thickness of, for example, equal to or less than one atomic layer. Here, Te acts as an n-type dopant in an Sb-based semiconductor material including Sb such as AlSb. Here, Te with which the doping is performed has an atomic radius larger than that of Si, and thus has a decreased diffusion coefficient in an InAlAs layer (spacer layer 14 and barrier layer 18) and an InGaAs layer (channel layer 13) which have a small lattice constant. In other words, Te is larger and heavier than Si, and thus diffuses less to the InAlAs layer (spacer layer 14 and barrier layer 18) and the InGaAs layer (channel layer 13). In addition, the AlSb layers 15 and 17 doped with Te are provided in the InAlAs layers 14 and 18 having a lattice constant smaller than those of the AlSb layers, and thus the doped Te remains in the AlSb layers 15 and 17, thereby allowing the diffusion of Te to the InAlAs layer (spacer layer 14 and barrier layer 18) and the InGaAs layer (channel layer 13) to be suppressed (for example, see FIG. 16). In this manner, it is possible to suppress the diffusion of impurity atoms (here, Te) serving as an electron supply source to the InAlAs spacer layer 14 and the InGaAs channel layer 13. As a result, it is possible to suppress reductions in electron velocity and electron mobility due to ionized impurity scattering, that is, the deterioration in characteristics. In this manner, it is possible to enhance characteristics by improving the semiconductor multi-layer structure to be epitaxially grown. Meanwhile, the Te δ-doping layer 16 is also referred to as a Te doping layer, a Te planar doping layer, a Te layer, or a Te atomic layer. In addition, lattice constants (crystal lattice constants) of InAlAs and InGaAs are approximately 0.5869 nm (in a case of being lattice-matched to InP), and a lattice constant of AlSb is approximately 0.6136 nm. In addition, an atomic radius of Te is approximately 0.123 nm, and an atomic radius of Si is approximately 0.111 nm. In addition, an ionic radius of Te is approximately 0.140 nm, and an ionic radius of Si is approximately 0.110 nm. In addition, a covalent bond radius of Te is approximately 0.135 nm, and a covalent bond radius of Si is approximately 0.111 nm. Due to this, the ionic radius and the covalent bond radius of Te are greater than those of Si.

Meanwhile, the AlSb layer 15, the Te δ-doping layer 16, and the AlSb layer 17 are also referred to as a first portion (semiconductor layer) which contains Sb and has at least a portion doped with Te. Here, the first portion includes a doped portion doped with Te (here, a planar doped portion doped with Te in a planar shape) and undoped portions which are not doped with Te and have the doped portion interposed therebetween. In addition, the InAlAs spacer layer 14 and the InAlAs barrier layer 18 have a lattice constant smaller than those of the AlSb layers 15 and 17. For this reason, the InAlAs spacer layer 14 and the InAlAs barrier layer 18 are referred to as a second portion having a lattice constant smaller than that of the first portion. Here, the second portion contains InAlAs. In addition, the InAlAs spacer layer 14 and the InAlAs barrier layer 18 do not contain Sb. For this reason, the second portion is a portion that does not contain Sb. In this case, the electron supply layer 23 includes the first portion and the second portions with the first portion interposed therebetween. The second portion has a lattice constant smaller than that of the first portion. In particular, the InAlAs spacer layer 14 is located closer to the electron traveling layer 13 side than the AlSb layers 15 and 17 including the Te δ-doping layer 16, and has a lattice constant smaller than those of the AlSb layers 15 and 17 including the Te δ-doping layer 16. For this reason, the electron supply layer 23 contains Sb, and includes the first portion having at least a portion doped with Te and the second portion which is located closer to the electron traveling layer 13 side than the first portion and has a lattice constant smaller than that of the first portion. The AlSb layers 15 and 17 including the Te δ-doping layer 16 have a conduction band energy which is higher than those of the InAlAs spacer layer 14 and InAlAs barrier layer 18. For this reason, the first portion has a conduction band energy which is higher than that of the second portion. In addition, the electron supply layer 23 is an upper electron supply layer which comes into contact with the upper side of the electron traveling layer 13.

In addition, the InAlAs spacer layer 14 also functions as a barrier layer, similar to the InAlAs barrier layer 18. For this reason, the InAlAs spacer layer 14 is also referred to as an InAlAs barrier layer. In addition, the AlSb layers 15 and 17 are provided in the InAlAs barrier layers 14 and 18. The AlSb layers are semiconductor layers including a semiconductor material different from those of the InAlAs barrier layers 14 and 18 (that is, different types of semiconductor layers in the barrier layer) and have a conduction band energy which is higher than those of the InAlAs barrier layers 14 and 18. In addition, the Te δ-doping layer 16 is a portion which is δ-doped with Te as impurity atoms serving as an electron supply source, and thus is also referred to as a planar doped portion which is doped with Te in a planar shape. In addition, the Te δ-doping layer 16 is a portion in which an AlSb layer is δ-doped with Te, and the AlSb layers 15 and 17 with the Te δ-doping layer 16 interposed therebetween are undoped AlSb layers. In other words, a portion (here, a central portion in a thickness direction) of the undoped AlSb layers 15 and 17 is δ-doped with Te, and thus the Te δ-doping layer 16 is formed. In this case, a semiconductor layer (herein, the AlSb layers 15 and 17), which is provided in the barrier layers 14 and 18 and includes a semiconductor material different from the barrier layers 14 and 18, includes a δ-doped portion (planar doped portion) which is δ-doped with impurity atoms (here, Te) serving as an electron supply source and undoped portions which have the δ-doped portion interposed therebetween and are not doped with impurity atoms (here, Te) serving as an electron supply source. Meanwhile, the InAlAs barrier layers 14 and 18 are undoped InAlAs barrier layers, and thus are not doped with impurity atoms (here, Te) serving as an electron supply source. For this reason, the electron supply layer 23 includes the barrier layers 14 and 18 and the semiconductor layers 15 and 17 including a semiconductor material, different from the barrier layers 14 and 18, in the barrier layers 14 and 18. The semiconductor layers 15 and 17 include a planar doped portion which is doped with impurity atoms (here, Te) serving as an electron supply source in a planar shape. Here, the semiconductor layers 15 and 17 have a conduction band energy which is higher than those of the barrier layers 14 and 18.

Here, Te acts as an n-type dopant in the AlSb layer. For this reason, the semiconductor layer (first portion) doped with Te is assumed to be the AlSb layers 15 and 17, but the present disclosure is not limited thereto. In other words, Te acts as an n-type dopant in an Sb-based semiconductor material such as AlSb, GaSb, InSb, and a mixed crystal thereof. For this reason, the semiconductor layer doped with Te may be a semiconductor layer including an Sb-based semiconductor material such as AlSb, GaSb, InSb, and a mixed crystal thereof. In this manner, the semiconductor layer (first portion) doped with Te may contain Sb. For example, it is preferable that the semiconductor layer (first portion) doped with Te be a layer (layer including a III-Sb-based semiconductor material) which contains Sb and a Group III element. In other words, it is preferable that the semiconductor layer (first portion) doped with Te be an Sb and Group III semiconductor layer (III-Sb-based semiconductor layer). In addition, it is preferable that the semiconductor layer (first portion) doped with Te contain any one of AlSb, GaSb, AlGaSb, AlInSb, and AlGaInSb. In other words, it is preferable that the semiconductor layer (first portion) doped with Te be any one of an AlSb layer, a GaSb layer, an AlGaSb layer, an AlInSb layer, and an AlGaInSb layer. Meanwhile, a lattice constant of AlSb is approximately 0.6136 nm, a lattice constant of GaSb is approximately 0.6096 nm, and a lattice constant of InSb is approximately 0.6479 nm. For this reason, even when these materials are mixed to have any composition, a lattice constant of the mixed crystal is higher than that of InAlAs which is used for the barrier layer 18 and the spacer layer 14 (second portion).

Here, InAlAs is used for the barrier layer 18 and the spacer layer 14. However, the present disclosure is not limited thereto, and for example, InAlAsSb may be used. Meanwhile, when any of an AlSb layer, a GaSb layer, an AlGaSb layer, an AlInSb layer, and an AlGaInSb layer is used as the semiconductor layer (first portion) doped with Te, InAlAsSb used for the barrier layer 18 and the spacer layer 14 (second portion) is configured as a mixed crystal having such a composition that the lattice constant thereof is smaller than that of any of the layers.

The etching stop layer 19 is an InP layer and is an etching stop layer with respect to the cap layer 20. Here, the etching stop layer is an undoped InP layer, that is, an i-InP layer, and the thickness thereof is approximately 3 nm. Meanwhile, the etching stop layer 19 also has a function as a protection layer that inhibits the InAlAs electron supply layer from being oxidized.

The cap layer 20 is an InGaAs layer. Here, the protection layer is an n-InGaAs layer which is given n-type conductivity by being doped with Si. For example, the cap layer is an n-In$_{0.53}$Ga$_{0.47}$As layer. The cap layer has a thickness of approximately 20 nm and an Si doping amount of approximately $2 \times 10^{19}$ cm$^{-3}$, Meanwhile, the cap layer may be configured as a cap layer having a two-layered structure by stacking an n-In$_{0.70}$Ga$_{0.30}$As layer on an n-In$_{0.53}$Ga$_{0.47}$As layer. In addition, the cap layer may be configured as a cap layer having a two-layered structure by stacking an n-type InGaAs layer and an n-type InAlAs layer on each other.

Figure 2:
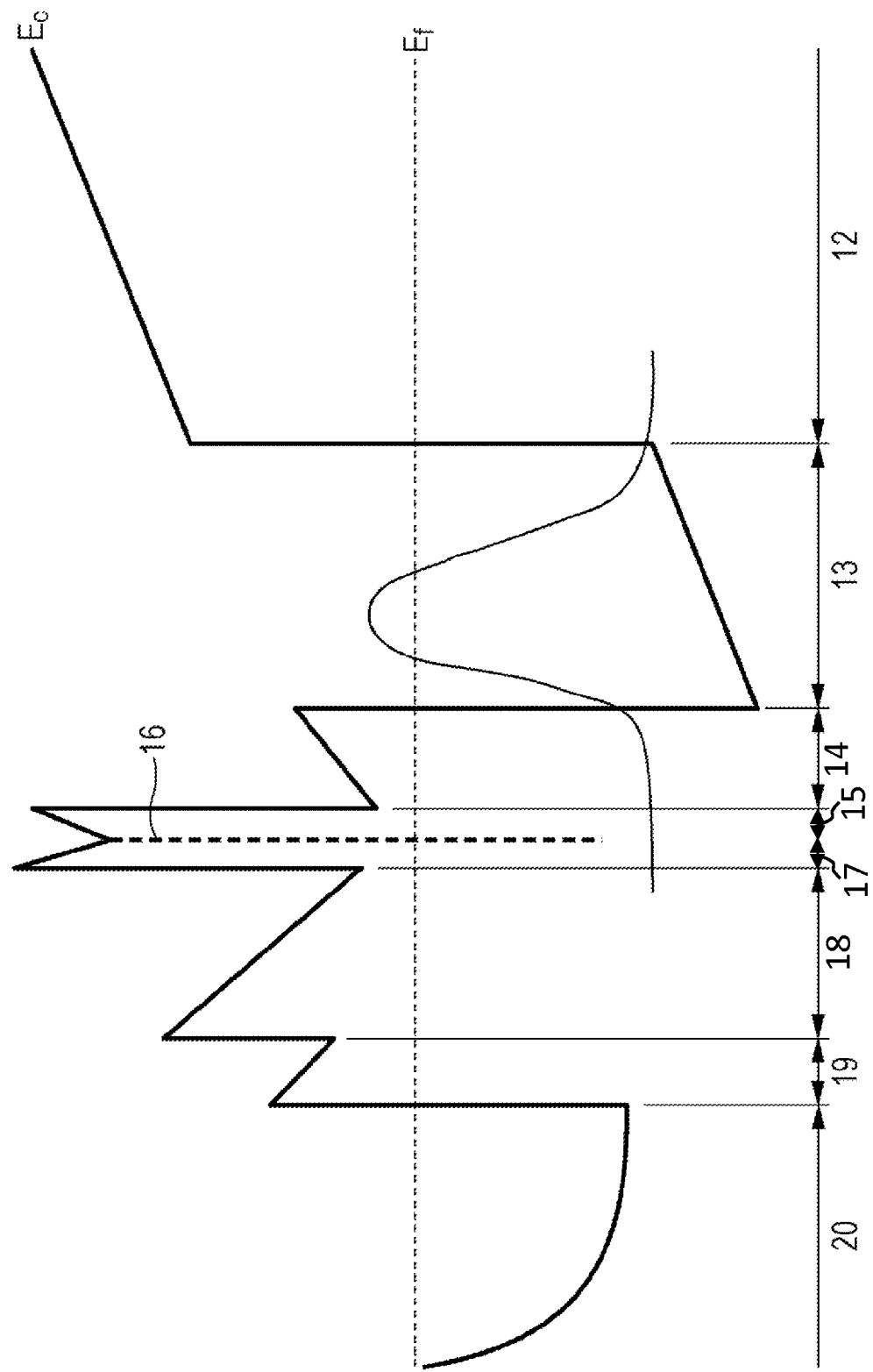
FIG. 2 is a schematic diagram illustrating a conduction band structure of the semiconductor device (InAlAs/InGaAs-based HEMT; InP-based HEMT) according to this embodiment.
Figure 3:
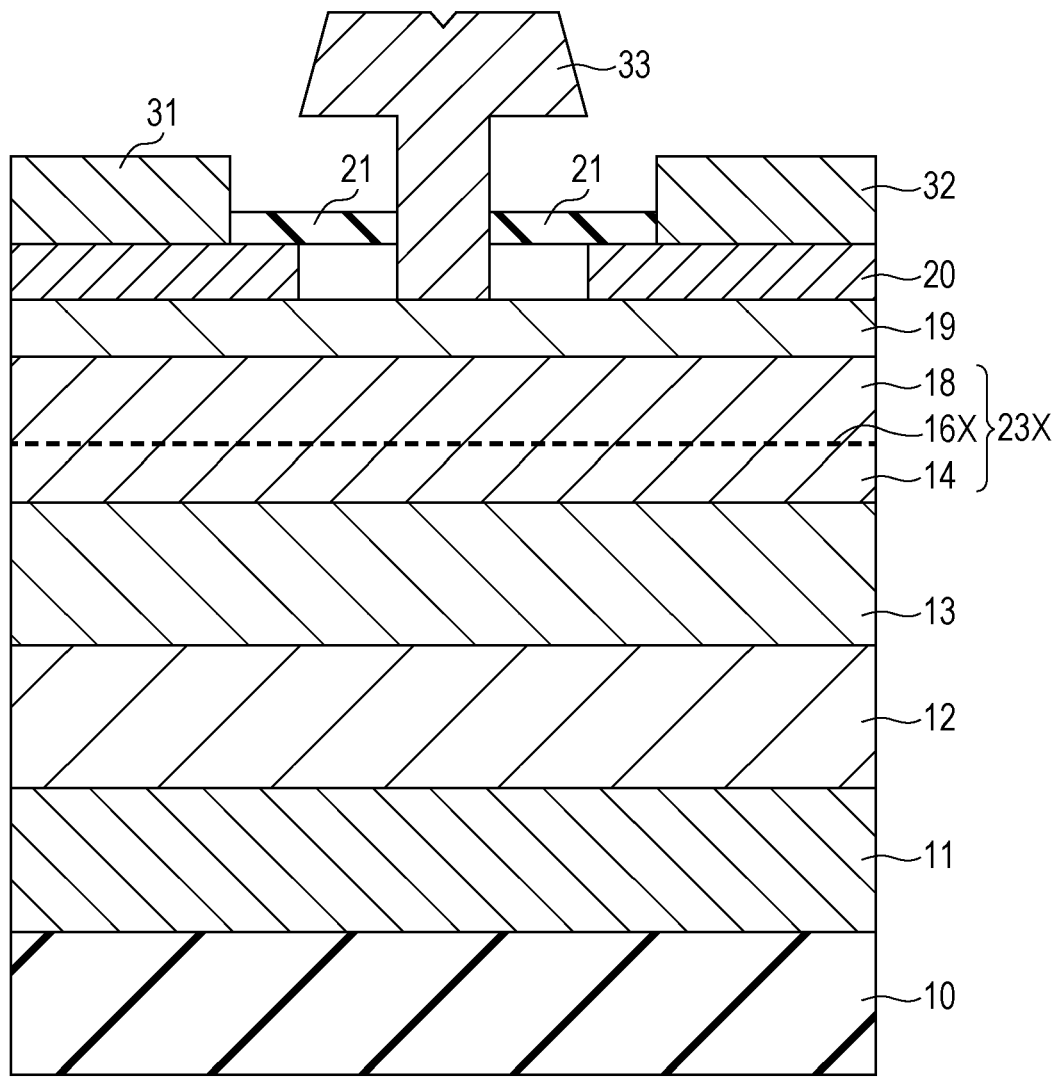
FIG. 3 is a schematic cross-sectional view illustrating the configuration of a semiconductor device (InAlAs/InGaAs-based HEMT; InP-based HEMT) according to a comparative example.
Figure 4:
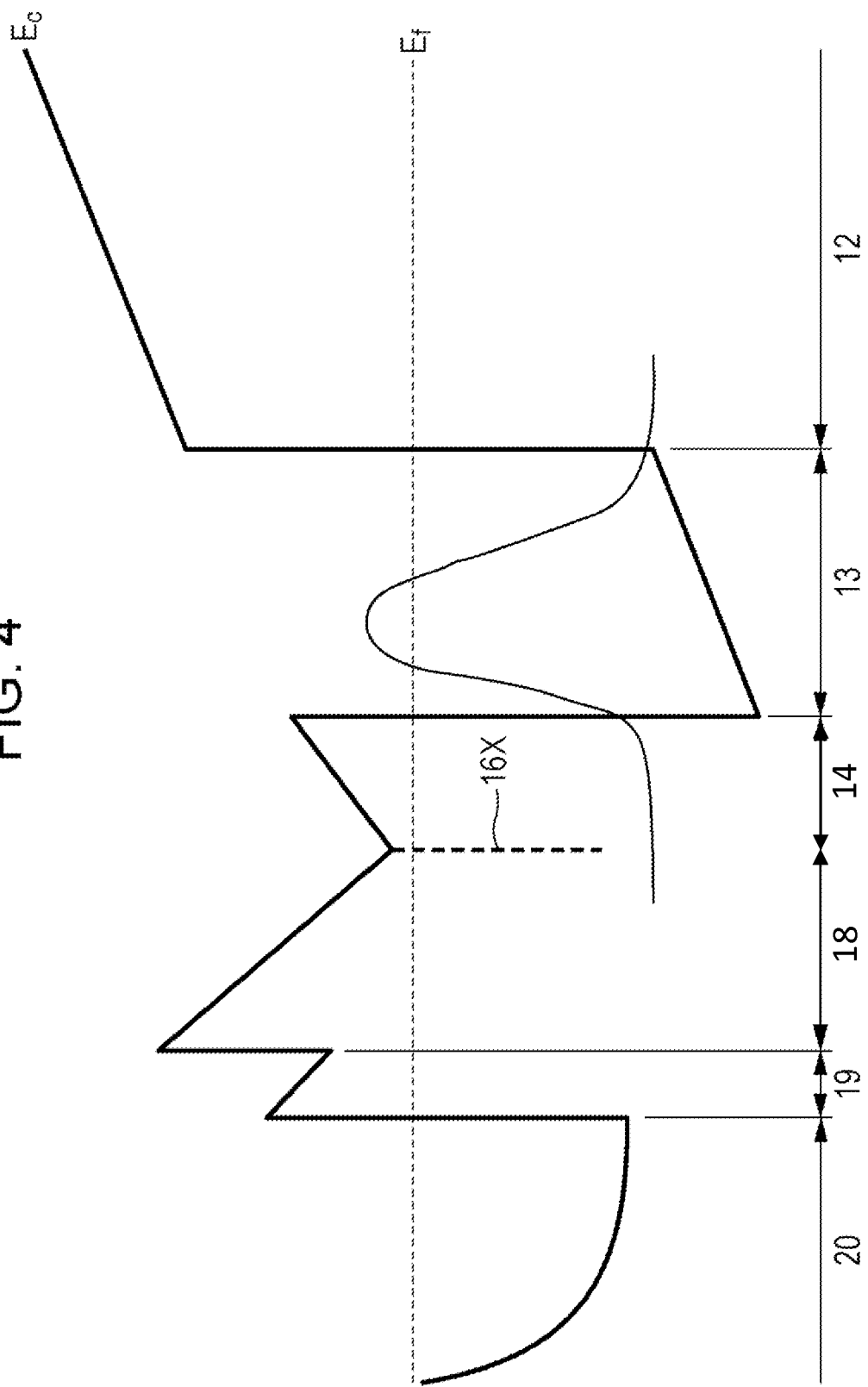
FIG. 4 is a schematic diagram illustrating a conduction band structure of the semiconductor device (InAlAs/InGaAs-based HEMT; InP-based HEMT) according to the comparative example.

A conduction band structure of the semiconductor multi-layer structure 22 which is configured in this manner is illustrated in FIG. 2. Meanwhile, in FIG. 2, a thin dashed line indicates a Fermi level $E_f$, a thick dashed line indicates that the corresponding portion is subjected to Te δ-doping, and a waveform in the InGaAs channel layer indicates electron distribution.

Meanwhile, the semiconductor multi-layer structure 22 may be a structure including at least the electron traveling layer 13 and the electron supply layer 23 above the substrate 10, or may be configured as other multi-layer structures. In addition, the semiconductor multi-layer structure 22 is also referred to as a heterostructure semiconductor layer.

The gate electrode 33, the source electrode 31, and the drain electrode 32 are provided on the semiconductor multi-layer structure 22 which is configured in this manner, and the surface of the semiconductor multi-layer structure 22 is covered with an SiO$_2$ film (insulating film) 21.

Here, the source electrode (metal electrode) 31 and the drain electrode (metal electrode) 32 which use, for example, Ti/Pt/Au as an electrode metal are provided on the n-InGaAs cap layer 20. In addition, the gate electrode (metal electrode) 33 using, for example, Ti/Pt/Au as an electrode metal is provided on the i-InP layer 19.

Incidentally, in this embodiment, the electron supply layer 23 is configured in the above-mentioned manner for the following reason.

When the size of the gate length $L_g$ is reduced in order to realize the high speed performance of the HEMT, a distance between a gate and a channel is also shortened from the viewpoint of scaling. For this reason, the electron supply layer is thinned.

On the other hand, when InAlAs is used for the electron supply layer and Si δ-doping is performed thereon (for example, see FIG. 3), the thinning of the electron supply layer leads to a decrease in the amount of electrons supplied to the channel layer. For this reason, sheet resistance is reduced, and thus a δ-doping amount of Si is increased, thereby increasing the concentration thereof.

In accordance with the thinning of the electron supply layer (particularly, a spacer layer) and the high concentration δ-doping of Si, Si with which the δ-doping is performed widely diffuses to an InAlAs electron supply layer and diffuses to an InGaAs electron traveling layer in some cases.

In other words, Si with which the δ-doping is performed diffuses vertically in the thickness direction (depth direction) of the electron supply layer whilst not remaining in the initial position. For example, when the upper portion of the electron supply layer, the cap layer, and the like are grown at a high temperature after the Si δ-doping, Si distributed in a substantially planar shape (substantially δ-function shape) immediately after the doping diffuses vertically in the thickness direction of the electron supply layer.

In this manner, when Si δ-doping is performed at a low concentration (for example, approximately $5 \times 10^{12}$ cm$^{-2}$) due to a sufficiently large thickness of the spacer layer even when Si with which the δ-doping is performed diffuses, Si does not diffuse into the electron traveling layer as electron velocity and electron mobility in the electron traveling layer (channel layer) is decreased by ionized impurity scattering as illustrated in the schematic diagram of FIG. 5A illustrating impurity diffusion. Meanwhile, in FIG. 5A, a solid line A indicates a distribution of Si immediately after δ-doping in the depth direction (depth direction of a layer which is epitaxially grown; thickness direction), a solid line B indicates a distribution of Si after distribution in the depth direction, and a dashed line C indicates an interface between the spacer layer 14 and the channel layer 13.

However, when Si δ-doping is performed at a high concentration (for example, approximately $1 \times 10^{13}$ cm$^{-2}$) by thinning the spacer layer 14 (for example, 2 nm or less), the amount of Si (the amount of impurity diffusion) which diffuses into the electron traveling layer (channel layer) 13 is increased as illustrated in the schematic diagram of FIG. 5B illustrating impurity diffusion even when a growth temperature and a growth time are the same. Thus, it may be understood that electron velocity and electron mobility in the electron traveling layer 13 are decreased due to ionized impurity scattering of Si which diffuses into the electron traveling layer 13. This phenomenon is a negative factor in realizing the high speed performance of the HEMT. Meanwhile, in FIG. 5B, a solid line A indicates a distribution of Si immediately after δ-doping in the depth direction (depth direction of a layer which is epitaxially grown; thickness direction), a solid line B indicates a distribution of Si after distribution in the depth direction, and a dashed line C indicates an interface between the spacer layer 14 and the channel layer 13.

Consequently, in this embodiment, the InAlAs electron supply layer 23 is thinned, the AlSb layers 15 and 17 (III-Sb-based semiconductor layers) which are ultrathin layers are provided in the InAlAs electron supply layer, and the AlSb layers 15 and 17 are δ-doped with Te as impurity atoms serving as an electron supply source, instead of thinning the InAlAs electron supply layer and performing Si δ-doping at a high concentration as described above. Thus, it is possible to suppress the diffusion of impurity atoms (here, Te) serving as an electron supply source to the InAlAs spacer layer 14 and the InGaAs channel layer 13. As a result, it is possible to suppress reductions in electron velocity and electron mobility due to ionized impurity scattering.

Here, InAlAs is used for an upper portion and a lower portion (outer portion) of the electron supply layer 23, and AlSb is used for an intermediate portion (inner portion) which is interposed between the upper portion and the lower portion, thereby increasing a conduction band energy of the intermediate portion. In addition, planar doping (δ-doping) of impurity atoms serving as an electron supply source is performed on a middle position of the intermediate portion, having a high conduction band energy, in the thickness direction. Thus, as compared with a case of a comparative example in which InAlAs is used for an electron supply layer 23X and a Si δ-doping layer 16X is formed in the electron supply layer (see FIGS. 3 and 4) as illustrated in the conduction band structure of FIG. 2, it is possible to increase the bottom energy of a conduction band $E_C$ of a δ-doped portion in which energy is decreased. In other words, it is possible to reliably inhibit the energy of the δ-doped portion and the energy of the conduction band $E_C$ in the vicinity of the δ-doped portion from being decreased to equal to or less than a Fermi energy $E_f$. As a result, it is possible to suppress a parallel conduction phenomenon (parallel conduction) in which the δ-doped portion serves as a channel for conducting electrons and to suppress the deterioration in characteristics due to parallel conduction. In addition, the AlSb layers 15 and 17 have high a conduction band energy. For this reason, it is possible to suppress the inflow of channel electrons into the gate electrode 33 and to suppress a gate leakage current by providing the AlSb layers 15 and 17.

Meanwhile, when the size of the gate length $L_g$ is reduced in order to realize the high speed performance of the HEMT, a method of removing portions of the cap layer 20 just below the gate electrode 33 and the electron supply layer 23 is used as a method of thinning the electron supply layer 23 in order to shorten a distance between a gate and a channel from the viewpoint of scaling. Thus, portions other than a portion just below the gate electrode 33 have a large thickness of the electron supply layer 23, and the cap layer 20 is also present, and thus it is possible to maintain high-electron concentration.

Next, a method of manufacturing a semiconductor device (InP-based HEMT; InAlAs/InGaAs-based HEMT) according to this embodiment will be described with reference to FIGS. 6 to 15.

Figure 6:
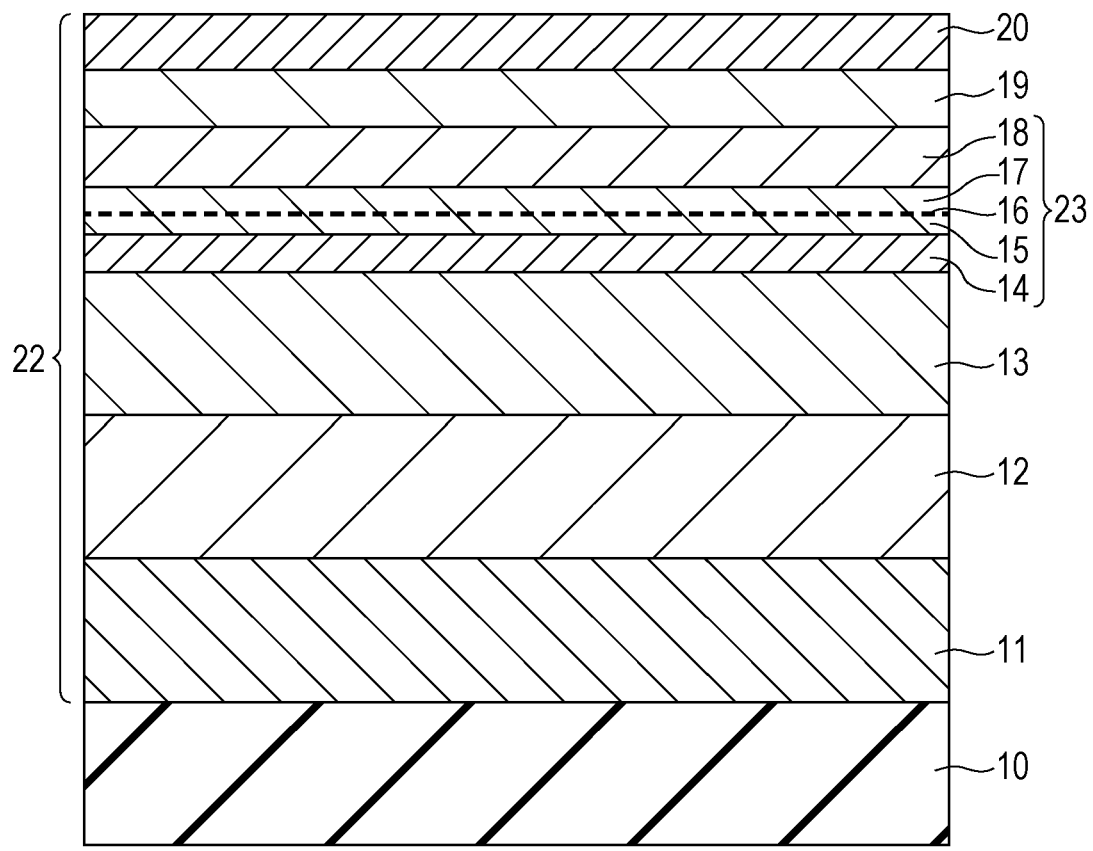
FIG. 6 is a schematic cross-sectional view illustrating a method of manufacturing the semiconductor device (InAlAs/InGaAs-based HEMT; InP-based HEMT) according to this embodiment.

First, as illustrated in FIG. 6, the i-In$_{0.52}$Al$_{0.48}$As spacer layer 14, the i-AlSb layer 15, the Te δ-doping layer 16, the i-AlSb layer 17, the i-In$_{0.52}$Al$_{0.48}$As barrier layer 18, the i-InP etching stop layer 19, and the n-In$_{0.53}$Ga$_{0.47}$As cap layer 20 which constitute the buffer layer 11, the i-In$_{0.52}$Al$_{0.48}$As layer 12, the i-InGaAs electron traveling layer 13, and the electron supply layer 23 are sequentially stacked on the semi-insulating InP substrate 10 by using, for example, a molecular beam epitaxy (MBE) method to thereby form the semiconductor multi-layer structure 22. Meanwhile, a crystal growth method is not limited to the MBE method, and it is also possible to use, for example, metal organic chemical vapor deposition (MOCVD).

Here, the thickness of the buffer layer 11 is set to approximately 1000 nm. The thickness of the i-In$_{0.52}$Al$_{0.48}$As layer 12 is set to approximately 200 nm. In addition, the thickness of the i-InGaAs electron traveling layer 13 is set to approximately 10 nm. In addition, the thickness of the i-In$_{0.52}$Al$_{0.48}$As spacer layer 14 is set to approximately 2 nm. In addition, the thickness of the i-AlSb layer 15 is set to approximately 0.6 nm. In the Te δ-doping layer 16, a δ-doping amount of Te is set to approximately $1 \times 10^{13}$ cm$^{-2}$. In addition, the thickness of the i-AlSb layer 17 is set to approximately 0.6 nm. In addition, the thickness of the i-In$_{0.52}$Al$_{0.48}$As barrier layer 18 is set to approximately 3 nm. In addition, the thickness of the i-InP etching stop layer 19 is set to approximately 3 nm. In addition, the thickness of the n-In$_{0.53}$Ga$_{0.47}$As cap layer 20 is set to approximately 20 nm, and an Si doping amount thereof is set to approximately $2 \times 10^{19}$ cm$^{-3}$.

Figure 7:
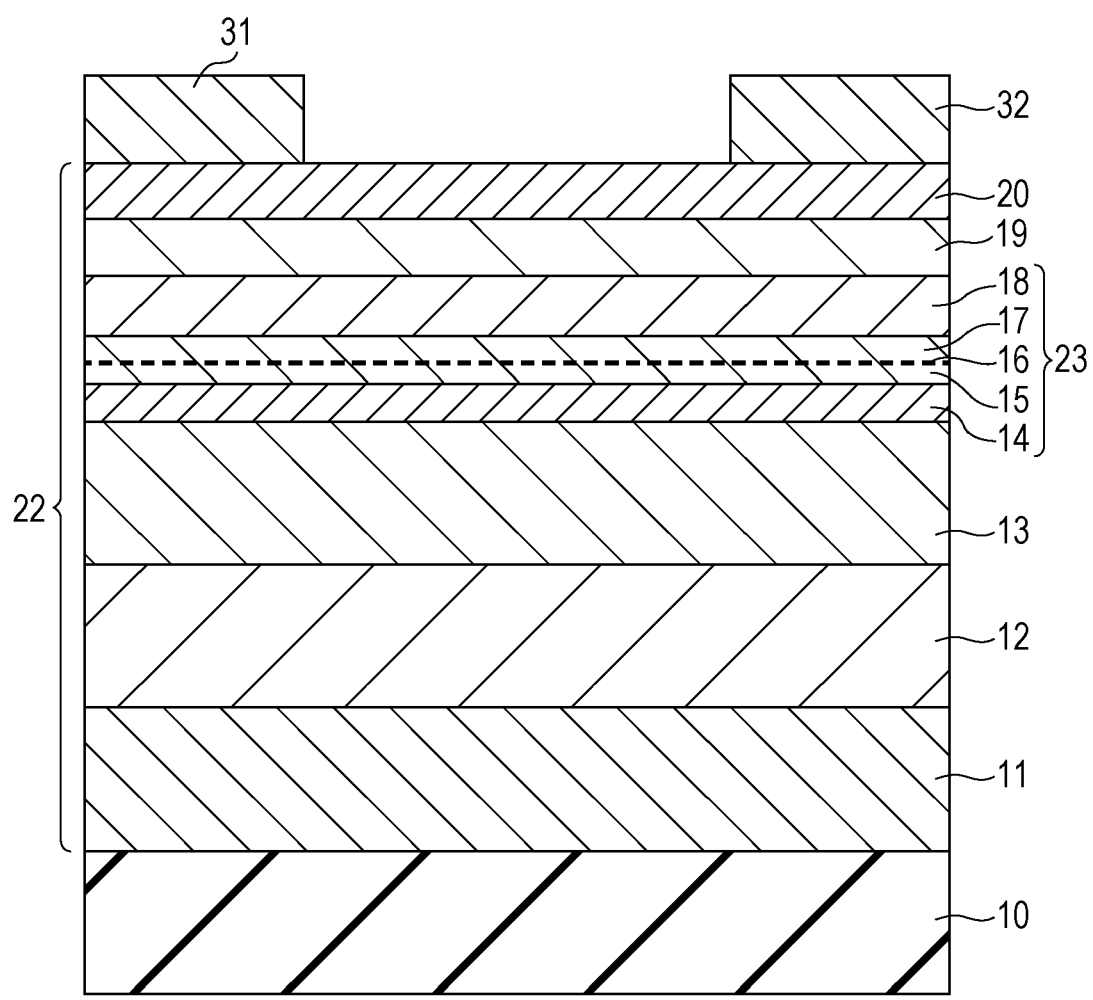
FIG. 7 is a schematic cross-sectional view illustrating the method of manufacturing the semiconductor device (InAlAs/InGaAs-based HEMT; InP-based HEMT) according to this embodiment.

Next, after the element separation, the source electrode 31 and the drain electrode 32 which have, for example, a three-layered structure of Ti/Pt/Au are formed as illustrating in FIG. 7. Thus, the source electrode 31 and the drain electrode 32 are formed on the n-In$_{0.53}$Ga$_{0.47}$As cap layer 20.

Figure 8:
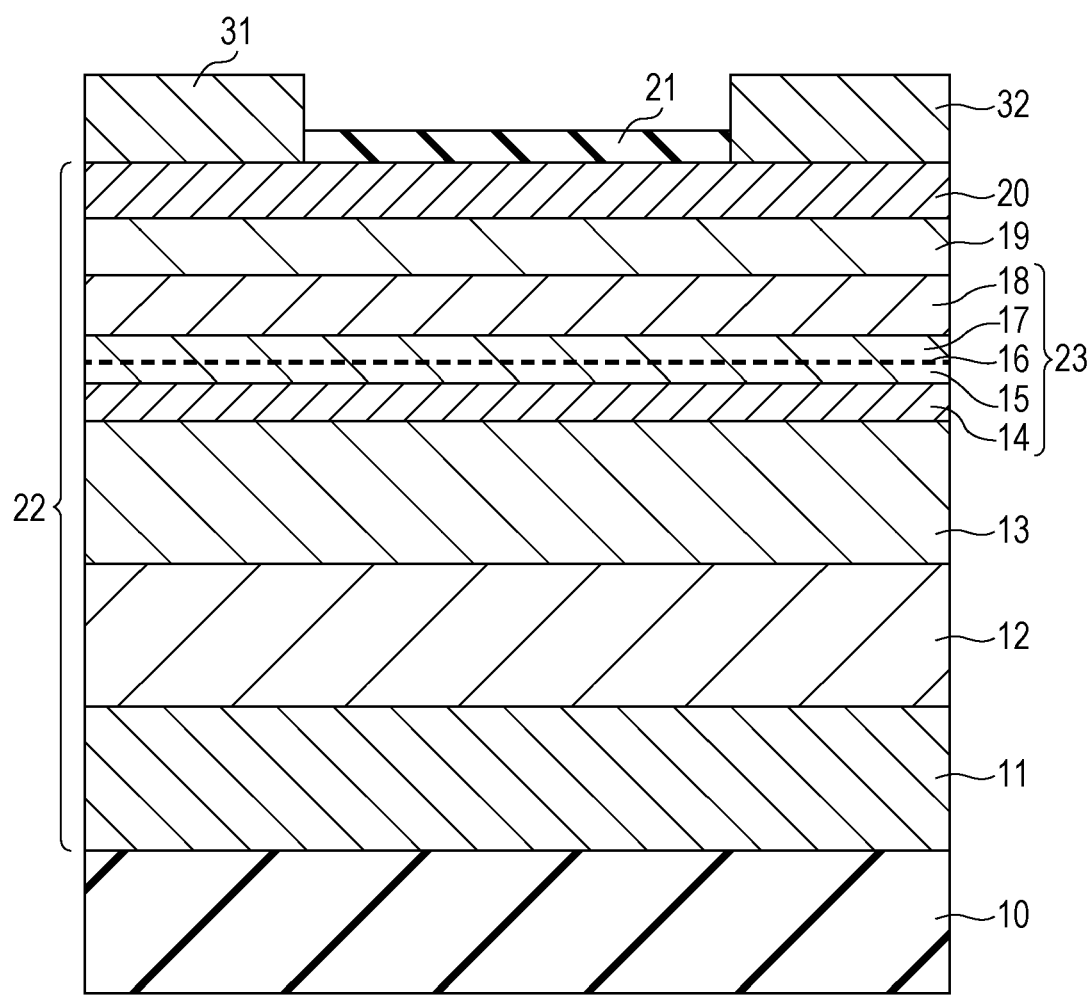
FIG. 8 is a schematic cross-sectional view illustrating the method of manufacturing the semiconductor device (InAlAs/InGaAs-based HEMT; InP-based HEMT) according to this embodiment.

Next, as illustrated in FIG. 8, the SiO$_2$ film 21 is formed on the n-In$_{0.53}$Ga$_{0.47}$As cap layer 20 between the source electrode 31 and the drain electrode 32 by using, for example, a plasma chemical vapor deposition (CVD) method. Here, the thickness of the SiO$_2$ film 21 is set to approximately 20 nm.

Next, as illustrated in FIGS. 9 to 15, the T-type gate electrode 33 is formed.

Figure 9:
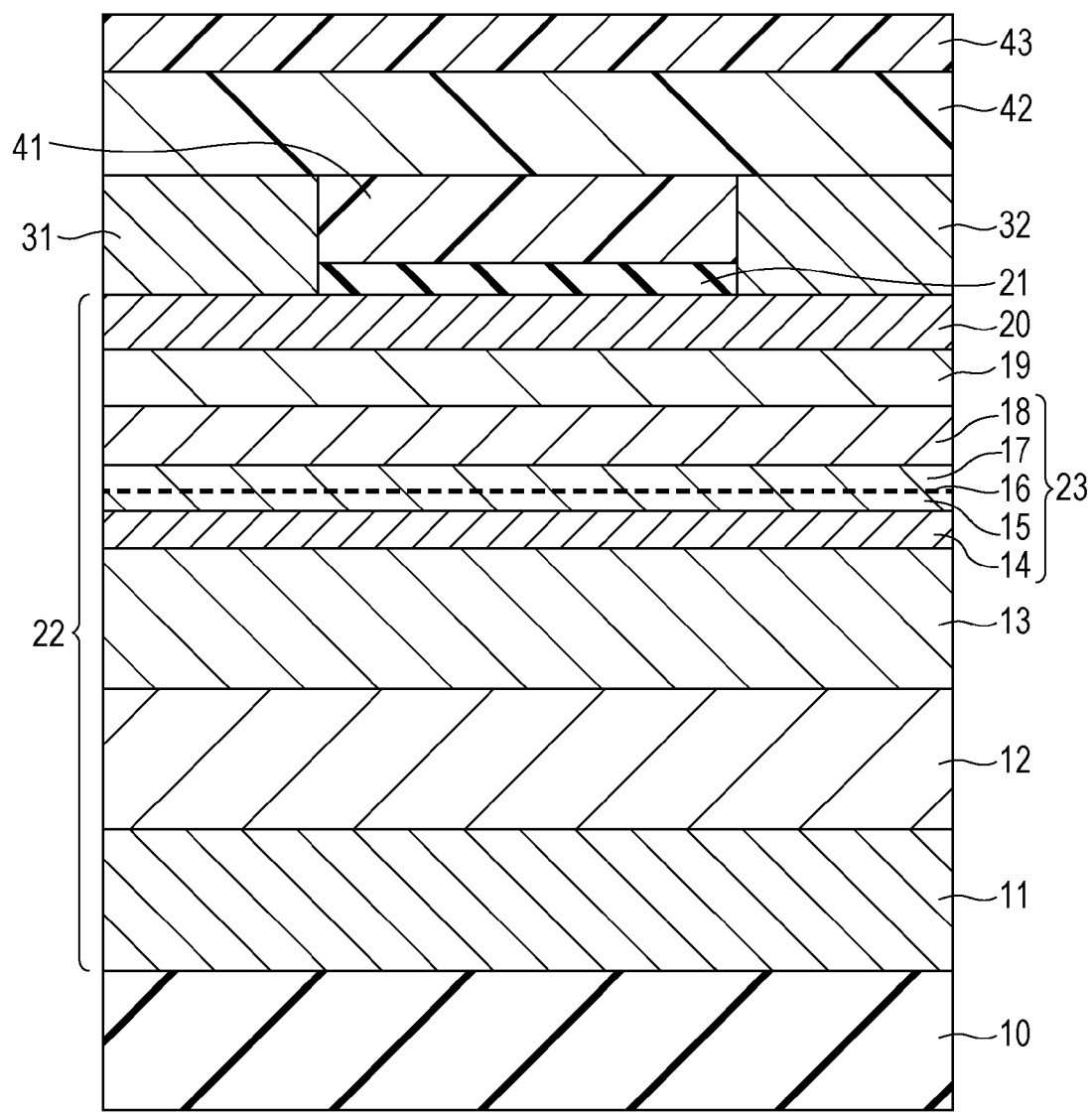
FIG. 9 is a schematic cross-sectional view illustrating the method of manufacturing the semiconductor device (InAlAs/InGaAs-based HEMT; InP-based HEMT) according to this embodiment.

In other words, first, as illustrated in FIG. 9, resist films 41 to 43 having a three-layered structure are formed. Here, a ZEP resist (manufactured by Nippon Zeon Co., Ltd.), a polydimethylglutarimide (PMGI) resist, and a ZEP resist are sequentially applied to thereby form a resist film having a three-layered structure in which the ZEP resist film 41, the PMGI resist film 42, and the ZEP resist film 43 are sequentially stacked.

Figure 10:
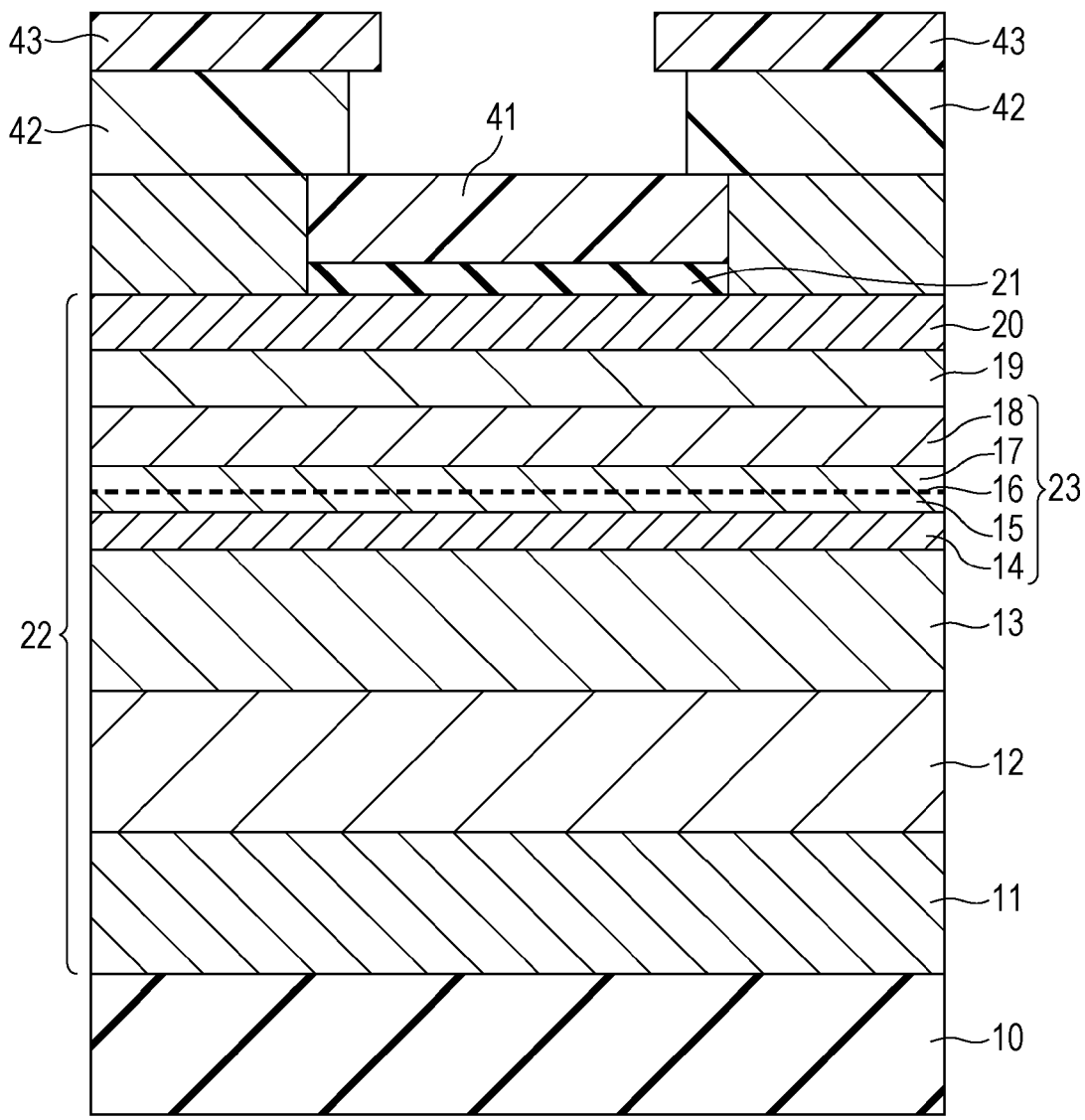
FIG. 10 is a schematic cross-sectional view illustrating the method of manufacturing the semiconductor device (InAlAs/InGaAs-based HEMT; InP-based HEMT) according to this embodiment.
Figure 11:
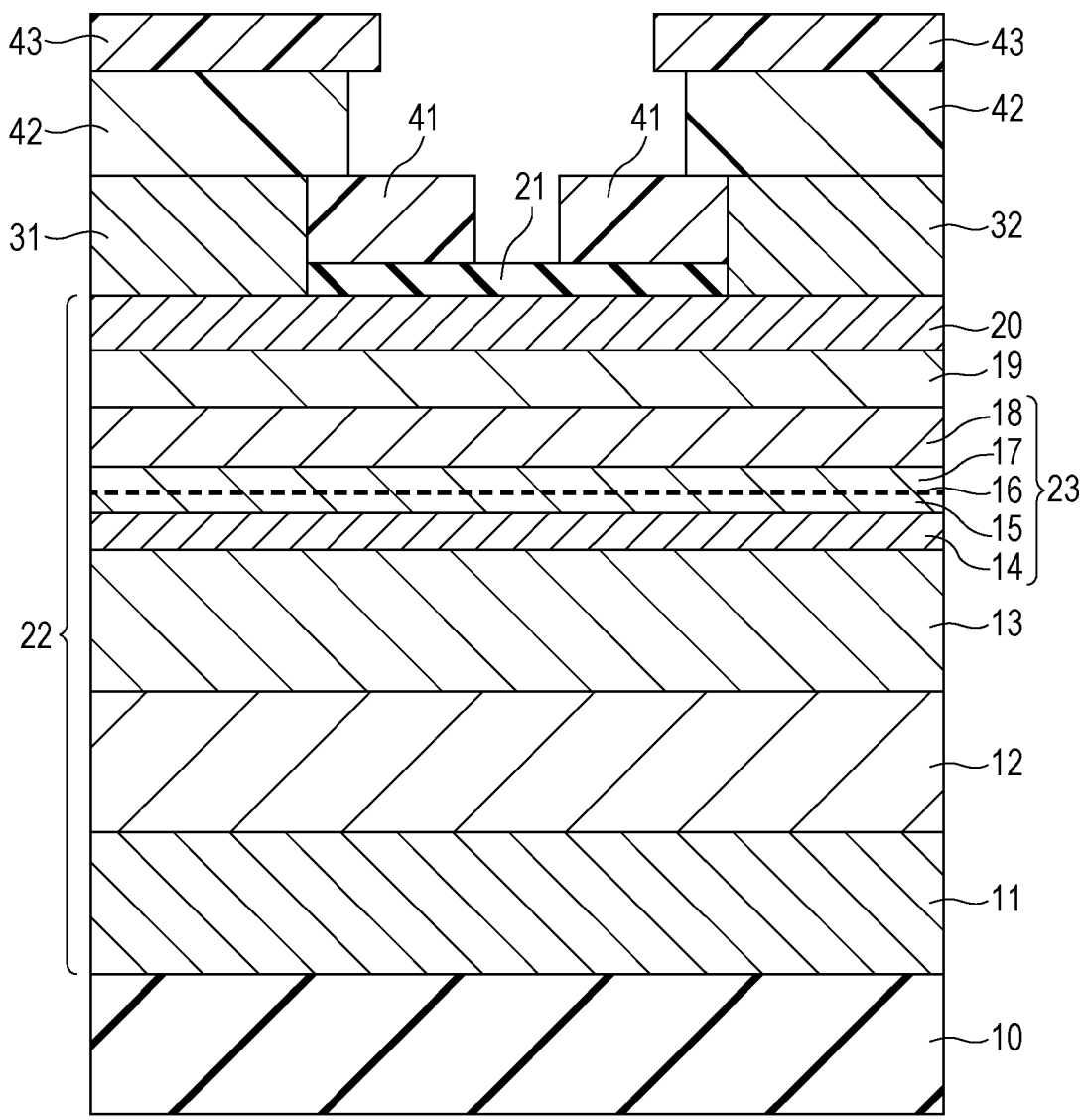
FIG. 11 is a schematic cross-sectional view illustrating the method of manufacturing the semiconductor device (InAlAs/InGaAs-based HEMT; InP-based HEMT) according to this embodiment.

Next, as illustrated in FIG. 10, a region having a head portion of the T-type gate electrode 33 being formed therein is exposed using, for example, an electron beam exposure method to thereby form an opening in the ZEP resist film 43 and the PMGI resist film 42. In addition, as illustrated in FIG. 11, a region having a foot portion of the T-type gate electrode 33 being formed therein is exposed using, for example, an electron beam exposure method to thereby form an opening in the ZEP resist film 41 which is the lowermost layer in accordance with a desired gate length.

Figure 12:
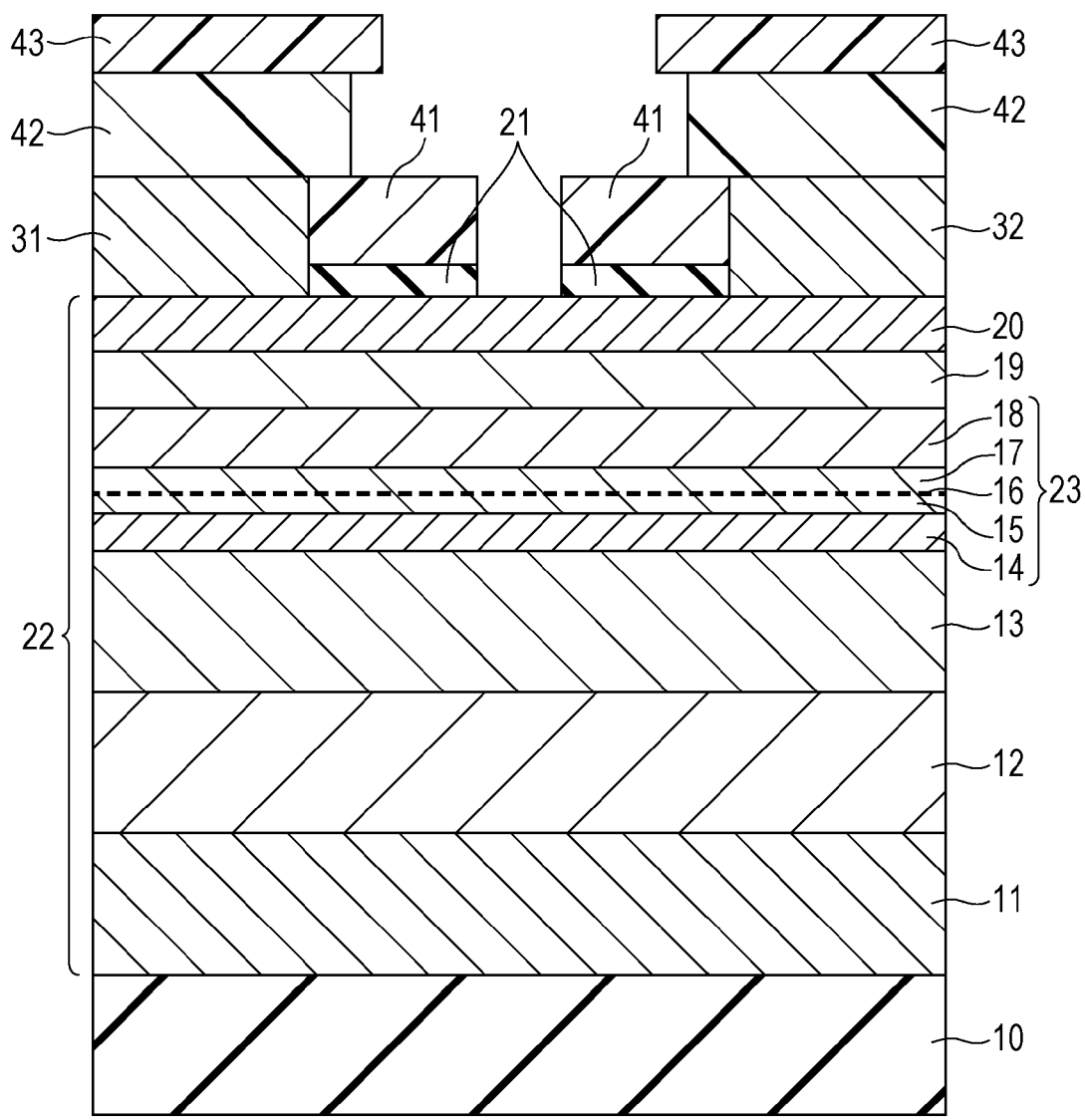
FIG. 12 is a schematic cross-sectional view illustrating the method of manufacturing the semiconductor device (InAlAs/InGaAs-based HEMT; InP-based HEMT) according to this embodiment.

Next, as illustrated in FIG. 12, an opening is formed in the SiO$_2$ film 21, for example, by reactive ion etching using CF$_4$ as an etching gas by using the ZEP resist film 41, which is the lowermost layer and has an opening formed in accordance with the gate length, as a mask.

Figure 13:
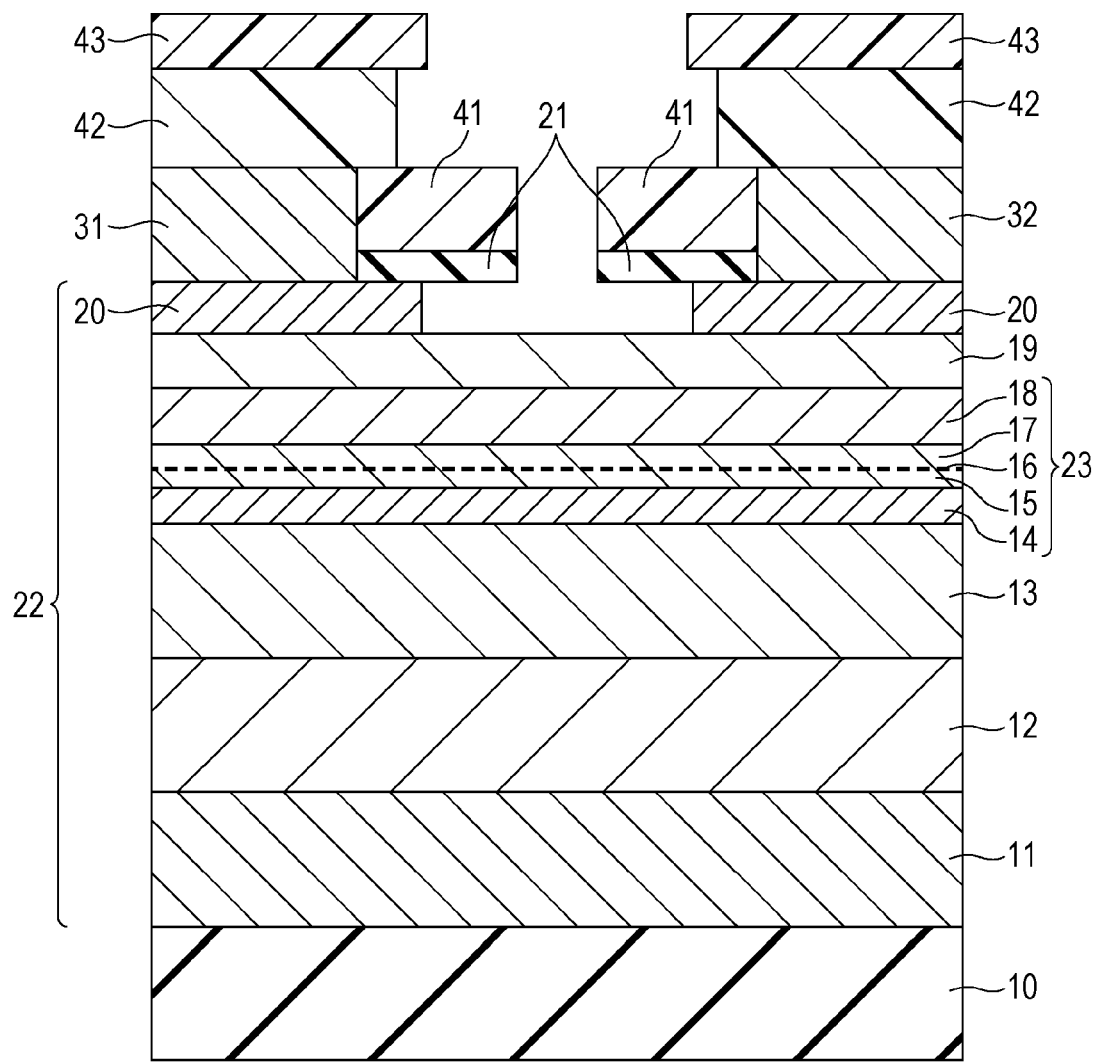
FIG. 13 is a schematic cross-sectional view illustrating the method of manufacturing the semiconductor device (InAlAs/InGaAs-based HEMT; InP-based HEMT) according to this embodiment.

Then, wet etching is performed using, for example, a mixed solution of citric acid (C$_6$H$_8$O$_7$) and aqueous hydrogen peroxide (H$_2$O$_2$) as an etching solution in order to electrically divide the n-type In$_{0.53}$Ga$_{0.42}$As cap layer 20, thereby forming a recess as illustrated in FIG. 13.

Figure 14:
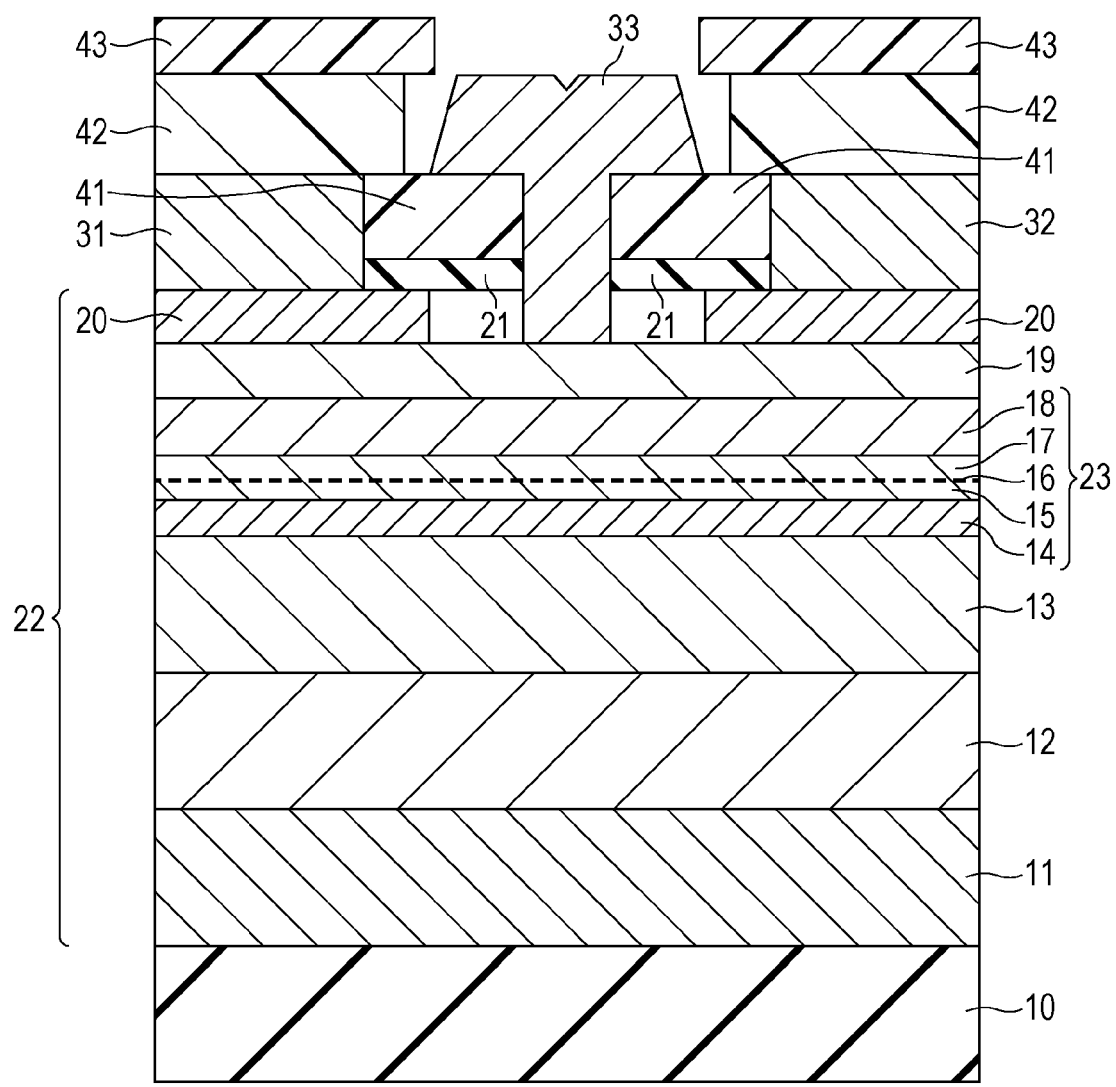
FIG. 14 is a schematic cross-sectional view illustrating the method of manufacturing the semiconductor device (InAlAs/InGaAs-based HEMT; InP-based HEMT) according to this embodiment.
Figure 15:
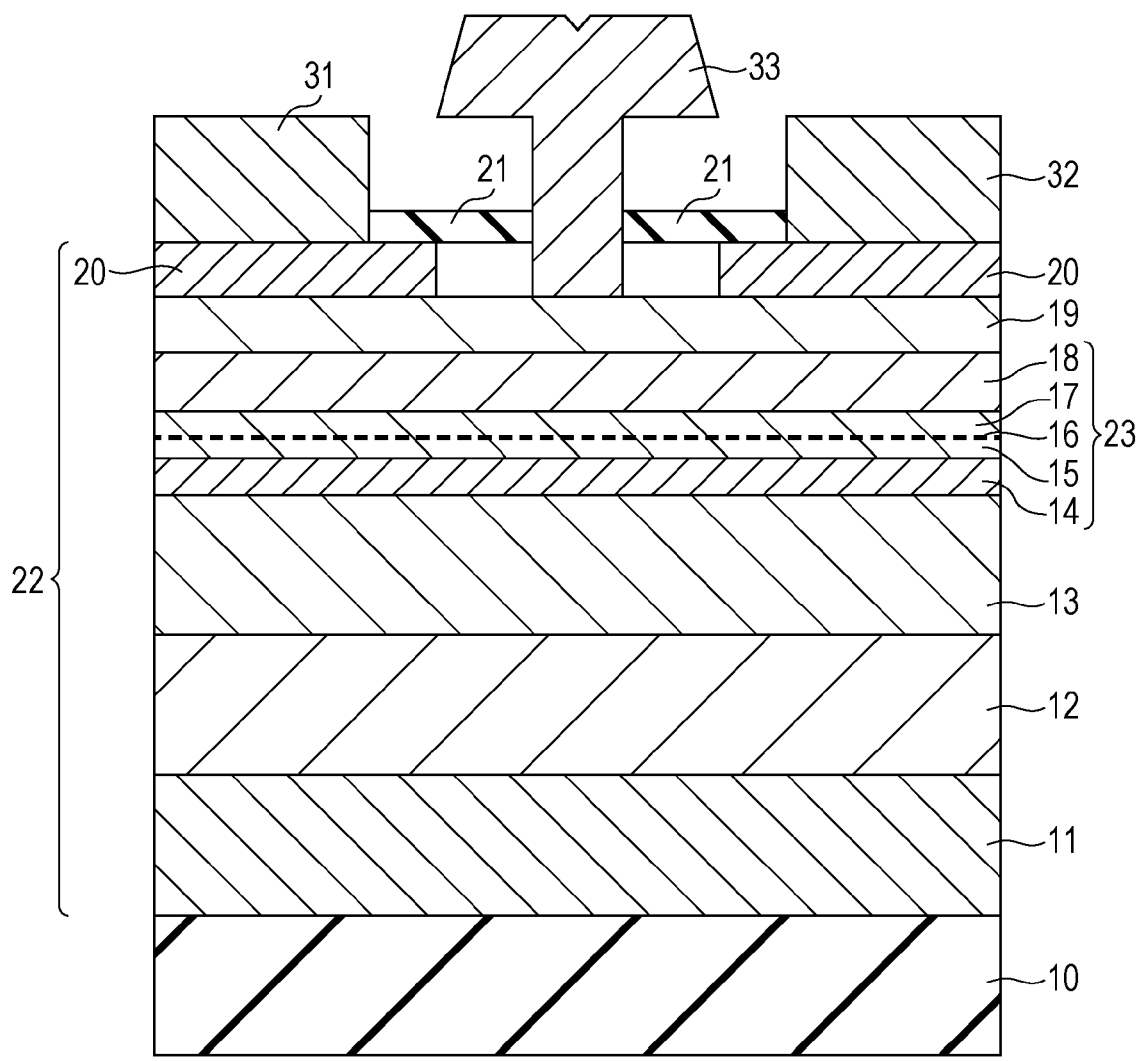
FIG. 15 is a schematic cross-sectional view illustrating the method of manufacturing the semiconductor device (InAlAs/InGaAs-based HEMT; InP-based HEMT) according to this embodiment.

Finally, as illustrated in FIG. 14, for example, Ti, Pt, and Au are deposited, and then lift-off is performed, and thus the T-type gate electrode 33, for example, having a three-layered structure of Ti/Pt/Au is formed as illustrated in FIG. 15. Thus, the gate electrode 33 is formed on the i-InP etching stop layer 19.

Therefore, according to the semiconductor device of this embodiment, there is an advantage in that it is possible to suppress reductions in electron velocity and electron mobility due to ionized impurity scattering.

For example, when InAlAs is used for the electron supply layer and Si δ-doping is performed on the electron supply layer (for example, see FIG. 3), Si with which the δ-doping is performed widely diffuses to the InAlAs spacer layer, and diffuses to the InGaAs electron traveling layer in some cases (see FIG. 5B). When Si which is impurities diffuses into the electron traveling layer, electrons traveling inside the electron traveling layer are subjected to ionized impurity scattering due to Si. As a result, electron velocity and electron mobility in the electron traveling layer are decreased.

Figure 16:
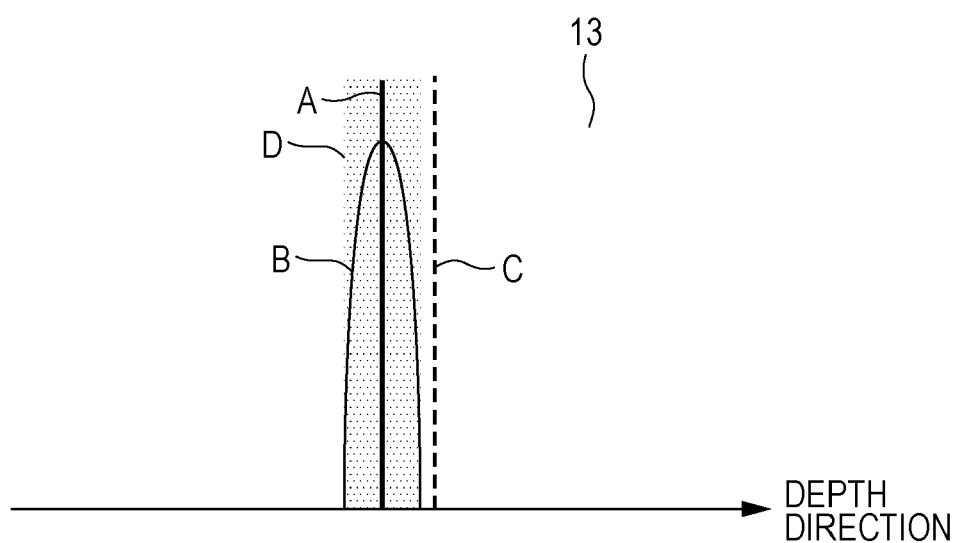
FIG. 16 is a diagram illustrating effects of the semiconductor device (InAlAs/InGaAs-based HEMT; InP-based HEMT) according to this embodiment.

On the other hand, in this embodiment, as described above, the AlSb layers 15 and 17 (III-Sb-based semiconductor layers) are provided in the electron supply layer 23 using InAlAs, and the AlSb layers 15 and 17 are δ-doped with Te as impurity atoms serving as an electron supply source. In this case, as illustrated in FIG. 16, Te is diffused in the AlSb layers 15 and 17 (III-Sb-based semiconductor layers) which have a large crystal lattice constant. However, Te has a large atomic radius, and thus is not likely to diffuse into an InAlAs layer (spacer layer 14) and an InGaAs layer (channel layer 13) which have a small crystal lattice constant. In other words, Te is not likely to diffuse into the InAlAs layer (spacer layer 14) and the InGaAs layer (channel layer 13) which have a lattice constant smaller than those of the AlSb layers 15 and 17 (III-Sb-based semiconductor layer) which are doped with Te. Thus, it is possible to suppress the diffusion of impurity atoms (here, Te) serving as an electron supply source to the InAlAs spacer layer 14 and the InGaAs channel layer 13. In particular, even when Te with which the δ-doping is performed is diffused into the AlSb layers 15 and 17 (III-Sb-based semiconductor layers), Te with which the δ-doping is performed does not diffuse into the InGaAs layer (channel layer 13). As a result, it is possible to suppress reductions in electron velocity and electron mobility in the channel layer due to ionized impurity scattering. Meanwhile, in FIG. 16, a solid line A indicates a distribution (Te δ-doping layer 16) in the depth direction (depth direction of a layer which is epitaxially grown; thickness direction) of Si immediately after δ-doping, a solid line B indicates a distribution in the depth direction of Si after diffusion, a dashed line C indicates an interface between the spacer layer 14 and the channel layer 13, and a portion with a pattern indicates the AlSb layers 15 and 17 (III-Sb-based semiconductor layers).

Meanwhile, in the above-described embodiment, the electron supply layer 23 is configured to have a structure in which the InAlAs spacer layer 14, the AlSb layer 15, the Te δ-doping layer 16, the AlSb layer 17, and the InAlAs barrier layer 18 are sequentially stacked, but is not limited thereto.

For example, the electron supply layer 23 may be configured to have a structure in which an InP spacer layer (second portion), an InAlAs spacer layer (second portion), an AlSb layer (first portion), a Te δ-doping layer (first portion; planar doped portion), an AlSb layer (first portion), an InAlAs barrier layer (second portion), and an InP barrier layer (second portion) are sequentially stacked. Specifically, the electron supply layer 23 may be configured to have a structure in which an i-InP spacer layer, an i-In$_{0.52}$Al$_{0.48}$As spacer layer, an AlSb layer, a Te δ-doping layer, an AlSb layer, an i-In$_{0.52}$Al$_{0.48}$As barrier layer, and an i-InP barrier layer are sequentially stacked. Meanwhile, in this case, the InP barrier layer may also double as an etching stop layer.

In this manner, an AlSb layer may be provided in an electron supply layer in which an InAlAs layer and an InP layer are stacked, and then may be δ-doped with Te as impurity atoms serving as an electron supply source.

In this case, a semiconductor layer (first portion) doped with Te may not be an AlSb layer and may be a layer containing Sb. For example, it is preferable that the semiconductor layer (first portion) doped with Te be a layer containing Sb and a Group III element (layer containing a III-Sb-based semiconductor material). In other words, it is preferable that the semiconductor layer (first portion) doped with Te be an Sb and Group III semiconductor layer (III-Sb-based semiconductor layer). In addition, it is preferable that the semiconductor layer (first portion) doped with Te be a layer containing any one of AlSb, GaSb, AlGaSb, AlInSb, and AlGaInSb. In other words, it is preferable that the semiconductor layer (first portion) doped with Te be any one of an AlSb layer, a GaSb layer, an AlGaSb layer, an AlInSb layer, and an AlGaInSb layer. In addition, a spacer layer and a barrier layer which constitute a second portion are configured as a layer in which an InAlAs layer and an InP layer are stacked on each other. In other words, the spacer layer and the barrier layer which constitute the second portion contain InAlAs, and further contain InP.

In the above-described embodiment, an InGaAs layer is configured as the electron traveling layer 13, and an InGaAs layer is configured as the cap layer 20, but the present disclosure is not limited thereto.

Figure 17:
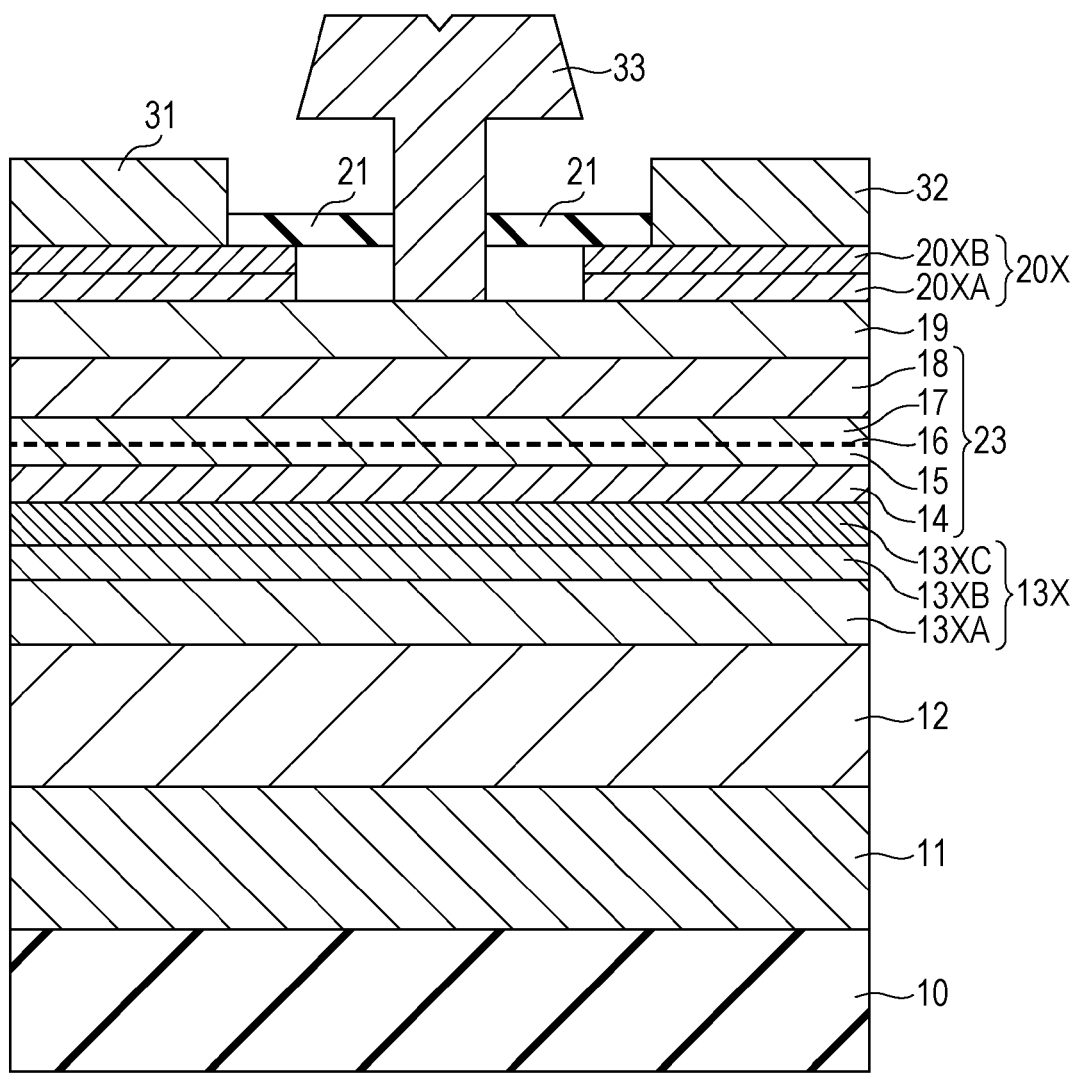
FIG. 17 is a schematic cross-sectional view illustrating the configuration of a semiconductor device (InAlAs/InGaAs-based HEMT; InP-based HEMT) according to a first modification example of this embodiment.
Figure 18:
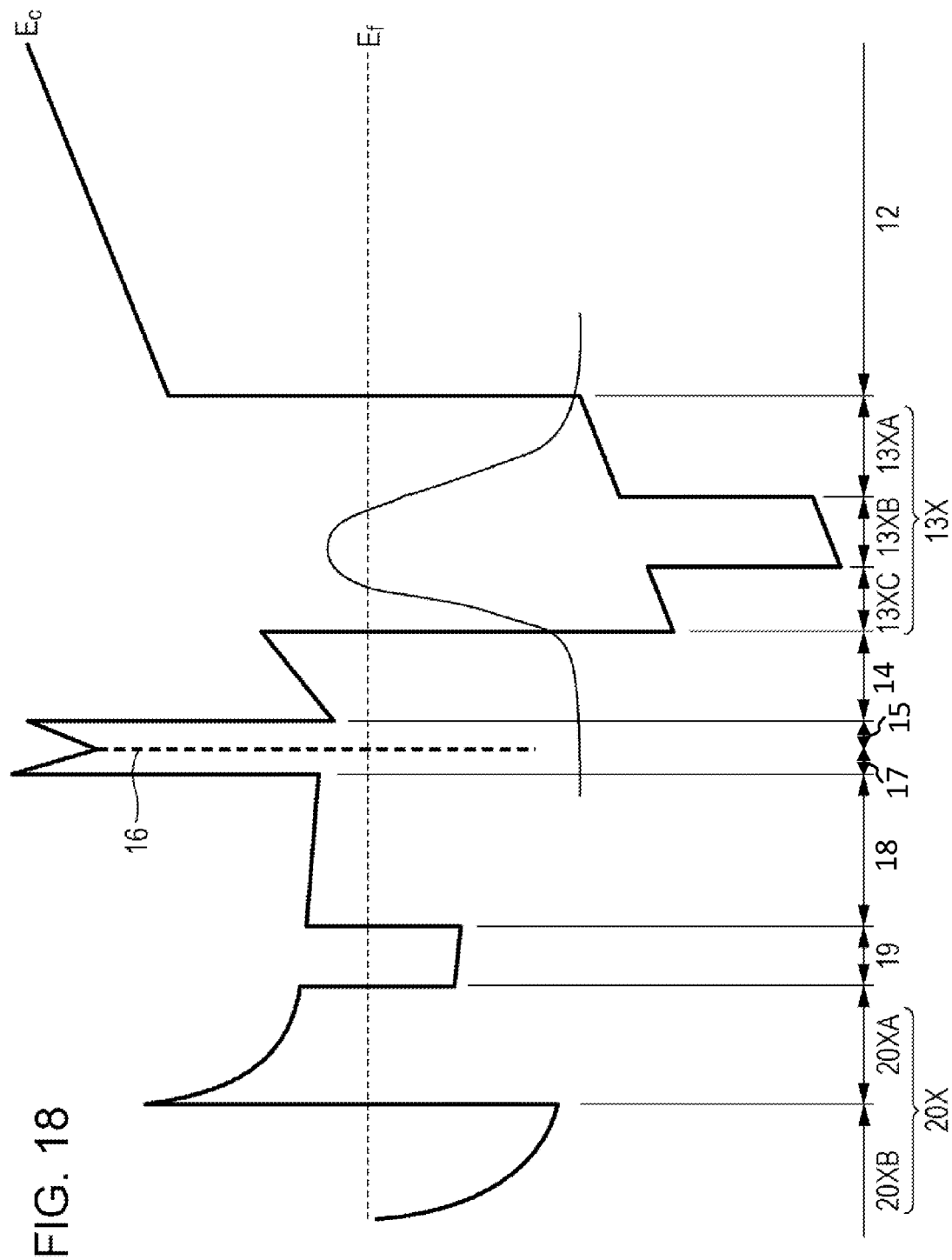
FIG. 18 is a schematic diagram illustrating a conduction band structure of the semiconductor device (InAlAs/InGaAs-based HEMT; InP-based HEMT) according to the first modification example of this embodiment.

For example, as illustrated in FIG. 17, an electron traveling layer 13X may be configured as a layer in which an InGaAs layer and an InAs layer are stacked on each other. Further, a cap layer 20X may be configured as a layer in which an InAlAs layer and an InGaAs layer are stacked on each other. Specifically, the electron traveling layer 13X may be configured as a layer in which an i-InGaAs layer 13XA, an i-InAs layer 13XB, and an i-InGaAs layer 13XC are stacked on each other. Further, the cap layer 20X may be configured as a layer in which an n-InAlAs layer (for example, n-In$_{0.52}$Al$_{0.48}$As layer) 20XA and an n-InGaAs layer (for example, n-In$_{0.53}$Ga$_{0.47}$As layer) 20XB are stacked on each other. With such a configuration, a conduction band structure is as illustrated in FIG. 18. Meanwhile, in FIG. 18, a thin dashed line indicates a Fermi level E$_f$, a thick dashed line indicates that the corresponding portion is subjected to Te δ-doping, and a waveform in the electron traveling layer 13X indicates electron distribution. Meanwhile, other details are the same as those in the above-described embodiment. This will be referred to as a first modification example.

Meanwhile, in this first modification example, the configurations of an electron traveling layer and a cap layer are changed with respect to those in the above-described embodiment. However, only the configuration of the electron traveling layer may be changed, or only the configuration of the cap layer may be changed. In addition, the electron traveling layer may be configured as an InAs layer.

In the above-described embodiment, an InP-based HEMT (InAlAs/InGaAs-based HEMT) has been described as an example, but a material system is not limited thereto.

For example, the present disclosure may also be applied to an AlGaAs/GaAs-based HEMT or an AlGaAs/InGaAs-based HEMT. This will be referred to as a second modification example.

Figure 19:
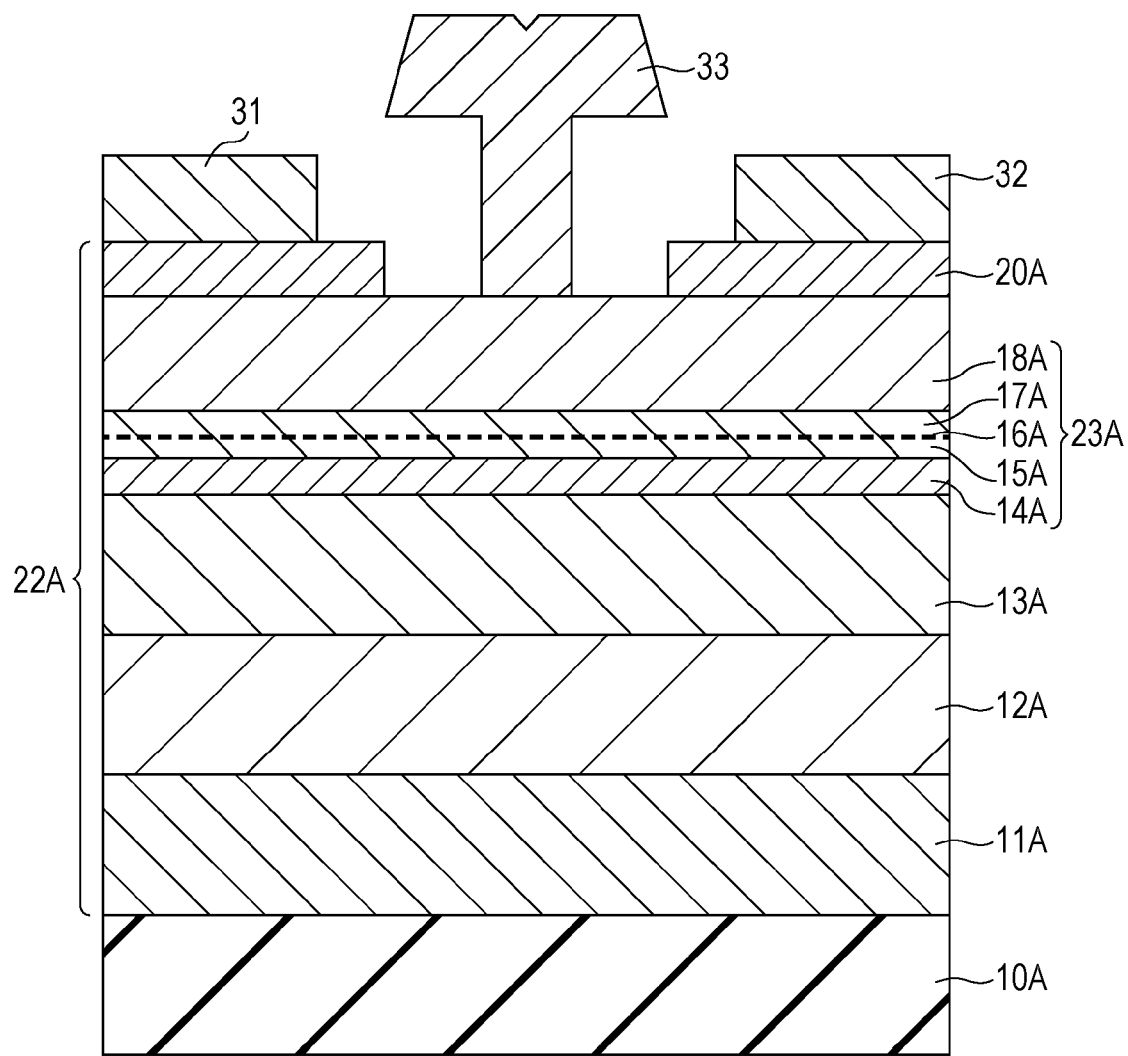
FIG. 19 is a schematic cross-sectional view illustrating the configuration of a semiconductor device (AlGaAs/GaAs-based HEMT or AlGaAs/InGaAs-based HEMT) according to a second modification example of this embodiment.
Figure 20:
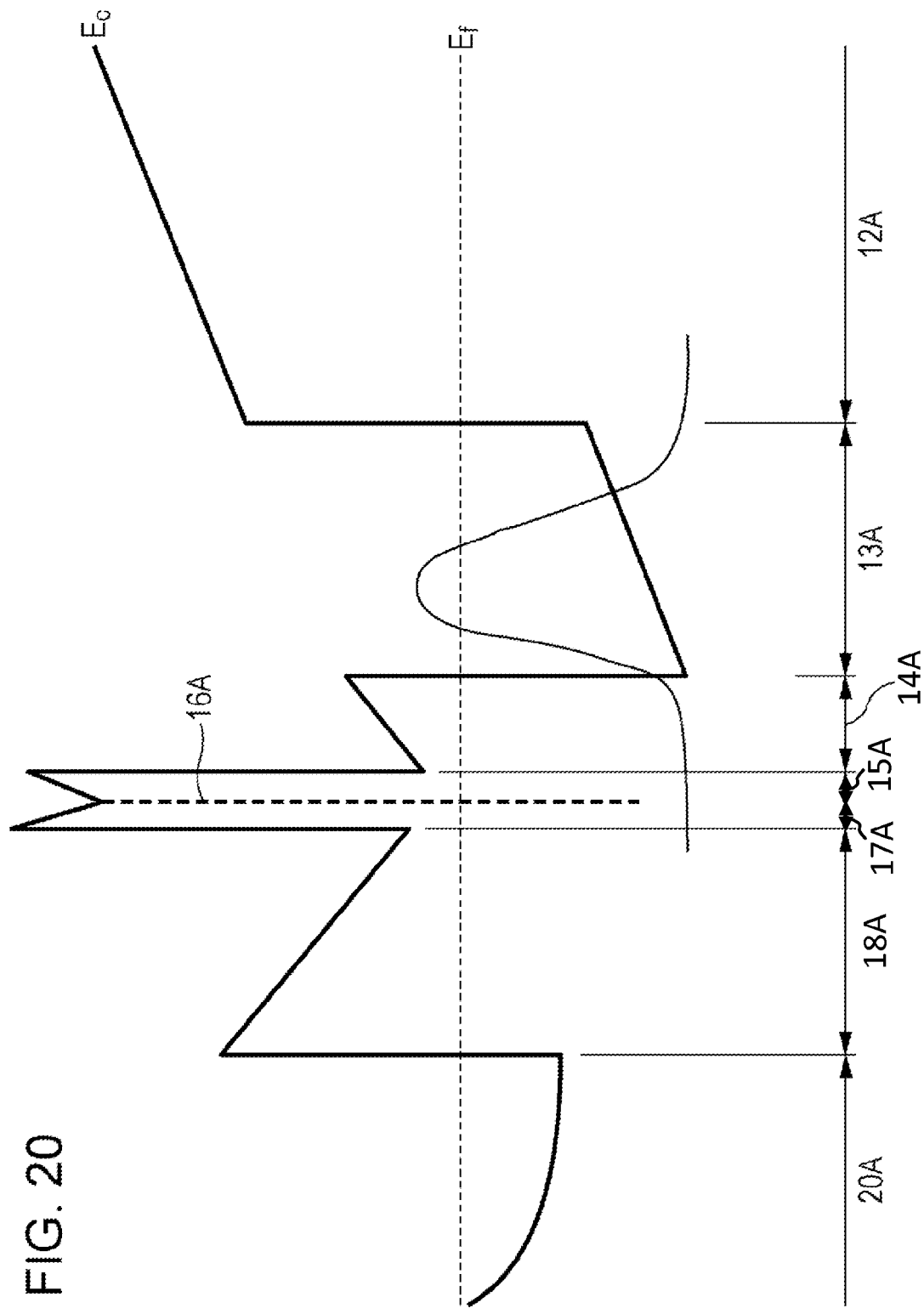
FIG. 20 is a schematic diagram illustrating a conduction band structure of the semiconductor device (AlGaAs/GaAs-based HEMT) according to the second modification example of this embodiment.

For example, as illustrated in FIG. 19, a semiconductor multi-layer structure 22A in which a buffer layer 11A, an AlGaAs lower barrier layer 12A, a GaAs electron traveling layer (channel layer) 13A, an electron supply layer (upper barrier layer) 23A, and a GaAs cap layer 20A are sequentially stacked on a GaAs substrate 10A may be provided. For example, the semiconductor multi-layer structure 22A in which the buffer layer 11A, the i-Al$_{0.3}$Ga$_{0.7}$As lower barrier layer 12A, the i-GaAs electron traveling layer 13A, the electron supply layer 23A, and the n-GaAs cap layer 20A are sequentially stacked on the GaAs substrate 10A may be provided. Then, the electron supply layer 23A may be configured to have a structure in which an AlGaAs spacer layer 14A (second portion), an AlSb layer 15A (first portion), a Te δ-doping layer 16A (first portion; planar doped portion), an AlSb layer 17A (first portion), and an AlGaAs barrier layer 18A (second portion) are sequentially stacked. Specifically, the electron supply layer 23A may be configured to have a structure in which the i-Al$_{0.3}$Ga$_{0.7}$As spacer layer 14A (second portion), the i-AlSb layer 15A (first portion), the Te δ-doping layer 16A (first portion; planar doped portion), the i-AlSb layer 17A (first portion), and the i-Al$_{0.3}$Ga$_{0.7}$As barrier layer 18A (second portion) are sequentially stacked. This will be referred to as an AlGaAs/GaAs-based HEMT. With such a configuration, a conduction band structure is as illustrated in FIG. 20. Meanwhile, in FIG. 20, a thin dashed line indicates a Fermi level $E_f$, a thick dashed line indicates that the corresponding portion is subjected to Te δ-doping, and a waveform in the GaAs channel layer 13A indicates electron distribution.

Here, the Al composition of the AlGaAs lower barrier layer 12A, the AlGaAs spacer layer 14A, and the AlGaAs barrier layer 18A is set to 0.3, but is not limited thereto.

In addition, the electron traveling layer 13A may be configured as an InGaAs layer such as, for example, an i-In$_x$Ga$_{1-x}$As electron traveling layer (x=approximately 0.15 to approximately 0.25) by adding a slight amount of InAs. In other words, the electron traveling layer 13A may be configured as a layer containing GaAs or InGaAs. In this case, the cap layer 20A may be configured as a GaAs layer (n-type GaAs layer), an InGaAs layer (n-type InGaAs layer), or a layer in which an InGaAs layer and a GaAs layer are stacked on each other (layer in which an n-type InGaAs layer and an n-type GaAs layer are stacked on each other). This will be referred to as an AlGaAs/InGaAs-based HEMT.

In this manner, the AlSb layers 15A and 17A may be provided in the electron supply layer 23A using AlGaAs, and the AlSb layers 15A and 17A may be δ-doped with Te as impurity atoms serving as an electron supply source. In particular, the AlGaAs electron supply layer 23A may be thinned, the AlSb layers 15A and 17A which are ultrathin layers may be provided in the AlGaAs electron supply layer, and the AlSb layers 15A and 17A may be δ-doped with Te as impurity atoms serving as an electron supply source at a high concentration.

Also in this case, similarly to the above-described embodiment, Te with which the doping is performed has an atomic radius which is larger than that of Si, and thus has a small diffusion coefficient in an AlGaAs layer (spacer layer 14A and barrier layer 18A) and a GaAs layer or an InGaAs layer (channel layer 13A) which have a small lattice constant. In other words, Te is larger and heavier than Si, and thus diffuses less to the AlGaAs layer (spacer layer 14A and barrier layer 18A) and the GaAs layer or the InGaAs layer (channel layer 13A). Then, the AlSb layers 15A and 17A doped with Te are provided in the AlGaAs layers 14A and 18A having a lattice constant smaller than those of the AlSb layers so that Te with which the doping is performed remains in the AlSb layers 15A and 17A, and thus it is possible to suppress the diffusion of Te to the AlGaAs layer (spacer layer 14A and barrier layer 18A) and the GaAs layer or the InGaAs layer (channel layer 13A). In this manner, it is possible to suppress the diffusion of impurity atoms (here, Te) serving as an electron supply source to the AlGaAs spacer layer 14A and the GaAs channel layer 13A. As a result, it is possible to suppress reductions in electron velocity and electron mobility due to ionized impurity scattering. Meanwhile, a lattice constant of each of AlGaAs and GaAs is approximately 0.5653 nm, a lattice constant of InGaAs is approximately 0.5869 nm, and a lattice constant of AlSb is approximately 0.6136 nm. In addition, an atomic radius of Te is approximately 0.123 nm, and an atomic radius of Si is approximately 0.111 nm. In addition, an ionic radius of Te is approximately 0.140 nm, and an ionic radius of Si is approximately 0.110 nm. In addition, a covalent bond radius of Te is approximately 0.135 nm, and a covalent bond radius of Si is approximately 0.111 nm. Due to this, Te has an ionic radius and a covalent bond radius which are larger than those of Si.

Here, AlGaAs is used for an upper portion and a lower portion (outer portion) of the electron supply layer 23A, and AlSb is used for an intermediate portion (inner portion) which is interposed between the upper portion and the lower portion, thereby increasing a conduction band energy of the intermediate portion. In addition, planar doping (δ-doping) of impurity atoms serving as an electron supply source is performed on a middle position of the intermediate portion, having a high conduction band energy, in the thickness direction. Thus, as illustrated in the conduction band structure of FIG. 20, it is possible to increase the energy bottom of a conduction band energy $E_C$ of a δ-doped portion in which energy is decreased. In other words, it is possible to inhibit the energy of the δ-doped portion and the energy of the conduction band $E_C$ in the vicinity of the δ-doped portion from being decreased to equal to or less than a Fermi energy $E_f$. As a result, it is possible to suppress a parallel conduction phenomenon (parallel conduction) in which the δ-doped portion serves as a channel for conducting electrons and to suppress the deterioration in characteristics due to the parallel conduction.

Meanwhile, the AlSb layer 15A, the Te δ-doping layer 16A, and the AlSb layer 17A are referred to as a first portion (semiconductor layer) which contains Sb and has at least a portion doped with Te. Here, the first portion includes a doped portion doped with Te (here, a planar doped portion doped with Te in a planar shape) and undoped portions which are not doped with Te and have the doped portion interposed therebetween. In addition, the AlGaAs spacer layer 14A and the AlGaAs barrier layer 18A have a lattice constant smaller than those of the AlSb layers 15A and 17A. For this reason, the AlGaAs spacer layer 14A and the AlGaAs barrier layer 18A are referred to as a second portion having a lattice constant smaller than that of the first portion. Here, the second portion contains AlGaAs. In addition, the AlGaAs spacer layer 14A and the AlGaAs barrier layer 18A do not contain Sb. For this reason, the second portion is a portion that does not contain Sb. In this case, the electron supply layer 23A includes the first portion and the second portions with the first portion interposed therebetween. The second portion has a lattice constant smaller than that of the first portion. In particular, the AlGaAs spacer layer 14A is located closer to the electron traveling layer 13A side than the AlSb layers 15A and 17A including the Te δ-doping layer 16A, and has a lattice constant smaller than those of the AlSb layers 15A and 17A including the Te δ-doping layer 16A. For this reason, the electron supply layer 23A contains Sb, and includes the first portion having at least a portion doped with Te and the second portion which is located closer to the electron traveling layer side than the first portion and has a lattice constant smaller than that of the first portion. The AlSb layers 15A and 17A including the Te δ-doping layer 16A have a conduction band energy which is higher than those of the AlGaAs spacer layer 14A and the AlGaAs barrier layer 18A. For this reason, the first portion has a conduction band energy which is higher than that of the second portion. In addition, the electron supply layer 23A is an upper electron supply layer which comes into contact with the upper side of the electron traveling layer 13A.

In addition, the AlGaAs spacer layer 14A also functions as a barrier layer, similar to the AlGaAs barrier layer 18A. For this reason, the AlGaAs spacer layer 14A is also referred to as an AlGaAs barrier layer. In addition, the AlSb layers 15A and 17A are provided in the AlGaAs barrier layers 14A and 18A. The AlSb layers are semiconductor layers including a semiconductor material different from those of the AlGaAs barrier layers 14A and 18A (that is, different types of semiconductor layers in the barrier layer) and have a conduction band energy which is higher than those of the AlGaAs barrier layers 14A and 18A. In addition, the Te δ-doping layer 16A is a portion which is δ-doped with Te as impurity atoms serving as an electron supply source, and thus is also referred to as a planar doped portion which is doped with Te in a planar shape. In addition, the Te δ-doping layer 16A is a portion in which an AlSb layer is δ-doped with Te, and the AlSb layers 15A and 17A with the Te δ-doping layer 16A interposed therebetween are undoped AlSb layers. In other words, a portion (here, a central portion in a thickness direction) of the undoped AlSb layers 15A and 17A is δ-doped with Te, and thus the Te δ-doping layer 16A is formed. In this case, a semiconductor layer (herein, the AlSb layers 15A and 17A), which is provided in the barrier layers 14A and 18A and includes a semiconductor material different from the barrier layers 14A and 18A, includes a δ-doped portion (planar doped portion) which is δ-doped with impurity atoms (here, Te) serving as an electron supply source and undoped portions which have the δ-doped portion interposed therebetween and are not doped with impurity atoms (here, Te) serving as an electron supply source. Meanwhile, the AlGaAs barrier layers 14A and 18A are undoped AlGaAs barrier layers, and thus are not doped with impurity atoms (here, Te) serving as an electron supply source. For this reason, the electron supply layer 23A includes the barrier layers 14A and 18A and the semiconductor layers 15A and 17A including a semiconductor material, different from the barrier layers 14A and 18A, in the barrier layers 14A and 18A. The semiconductor layers 15A and 17A include a planar doped portion which is doped with impurity atoms (here, Te) serving as an electron supply source in a planar shape. Here, the semiconductor layers 15A and 17A have a conduction band energy which is higher than those of the barrier layers 14A and 18A.

Here, Te acts as an n-type dopant in the AlSb layer. For this reason, the semiconductor layer (first portion) doped with Te is assumed to be the AlSb layer, but the present disclosure is not limited thereto. In other words, Te acts as an n-type dopant in an Sb-based semiconductor material such as AlSb, GaSb, InSb, and a mixed crystal thereof. For this reason, the semiconductor layer doped with Te may be a semiconductor layer including an Sb-based semiconductor material such as AlSb, GaSb, InSb, and a mixed crystal thereof. In this manner, the semiconductor layer (first portion) doped with Te may contain Sb. For example, it is preferable that the semiconductor layer (first portion) doped with Te be a layer (layer including a III-Sb-based semiconductor material) which contains Sb and a Group III element. In other words, it is preferable that the semiconductor layer (first portion) doped with Te be an Sb and Group III semiconductor layer (III-Sb-based semiconductor layer). In addition, it is preferable that the semiconductor layer (first portion) doped with Te contain any one of AlSb, GaSb, AlGaSb, AlInSb, and AlGaInSb. In other words, it is preferable that the semiconductor layer (first portion) doped with Te be any one of an AlSb layer, a GaSb layer, an AlGaSb layer, an AlInSb layer, and an AlGaInSb layer. Meanwhile, all of these layers have a lattice constant larger than that of AlGaAs which is used for the barrier layer 18A and the spacer layer 14A (second portion).

Accordingly, also in a case where the present disclosure is applied to an AlGaAs/GaAs-based HEMT or an AlGaAs/InGaAs-based HEMT, there is an advantage in that it is possible to suppress reductions in electron velocity and electron mobility due to ionized impurity scattering, similar to the above-described embodiment.

For example, a diffusion length $\sqrt{Dt}$ (D: diffusion coefficient, t: time) is calculated using diffusion coefficients of Si and Te at a growth temperature (approximately 500° C. to approximately 540° C.) which is a crystal growth condition of an HEMT and a crystal growth time (approximately 2 minutes to 3 minutes) after performing impurity δ-doping, and thus it may be understood that Si diffuses considerably into AlGaAs, while Te hardly diffuses.

In the above-described embodiment and modification examples, a description has been given of an example in which the electron supply layer configured in the above-described manner is applied to the upper electron supply layer (upper barrier layer) which comes into contact with the upper side of the electron traveling layer, but the present disclosure is not limited thereto.

Figure 21:
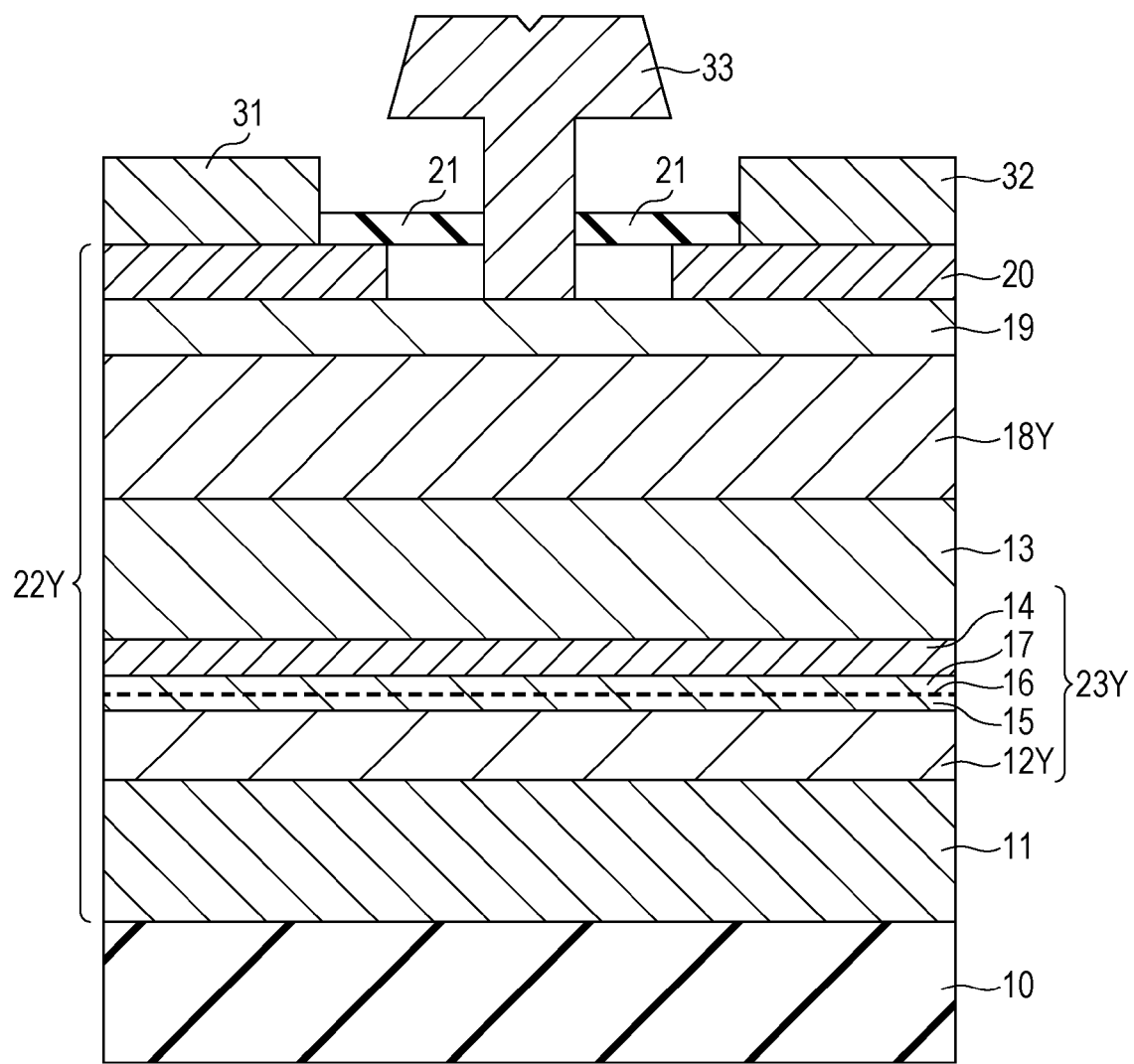
FIG. 21 is a schematic cross-sectional view illustrating the configuration of a semiconductor device (InAlAs/InGaAs-based HEMT; InP-based HEMT) according to a third modification example of this embodiment.

For example, as illustrated in FIG. 21, the electron supply layer configured in the above-described manner may be applied to a lower electron supply layer (lower barrier layer) 23Y which comes into contact with the lower side of the electron traveling layer 13. In other words, a semiconductor multi-layer structure 22Y may be configured as a structure in which the buffer layer 11, the electron supply layer (lower electron supply layer; lower barrier layer) 23Y, the electron traveling layer (channel layer) 13, an upper barrier layer 18Y, the etching stop layer 19, and the cap layer 20 are sequentially stacked, and the electron supply layer 23Y may be configured as a structure in which an InAlAs barrier layer 12Y, the AlSb layer 15, the Te δ-doping layer 16, the AlSb layer 17, and the InAlAs spacer layer 14 are sequentially stacked. In this manner, a semiconductor device may be configured to have a semiconductor multi-layer structure including at least an electron traveling layer and a lower electron supply layer coming into contact with the lower side of the electron traveling layer on a substrate, and the lower electron supply layer may be configured to include a first portion which contains Sb and has at least a portion doped with Te and a second portion which is located closer to the electron traveling layer side than the first portion and has a lattice constant smaller than that of the first portion. Meanwhile, FIG. 21 illustrates the configuration of the above-described embodiment (see FIG. 1) being changed, but a configuration may also be adopted in which the configurations of the above-described modification examples are changed. This will be referred to as a third modification example.

Figure 22:
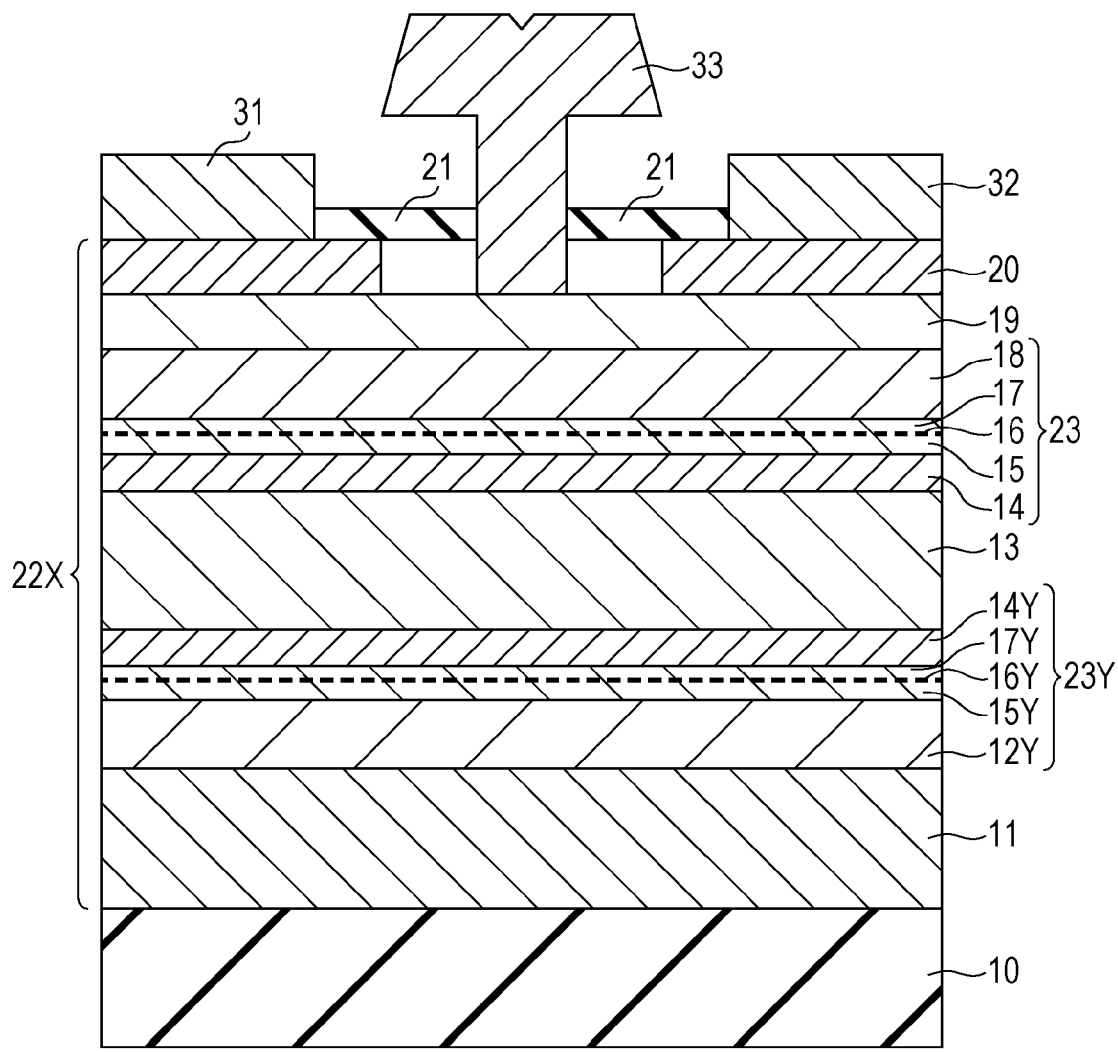
FIG. 22 is a schematic cross-sectional view illustrating the configuration of a semiconductor device (InAlAs/InGaAs-based HEMT; InP-based HEMT) according to a fourth modification example of this embodiment.

In addition, for example, as illustrated in FIG. 22, the electron supply layer configured in the above-described manner may be applied to an upper electron supply layer (upper barrier layer) which comes into contact with the upper side of an electron traveling layer and a lower electron supply layer (lower barrier layer) which comes into contact with the lower side of the electron traveling layer. In other words, a semiconductor multi-layer structure 22X may be configured as a structure in which the buffer layer 11, the electron supply layer (lower electron supply layer; lower barrier layer) 23Y, the electron traveling layer (channel layer) 13, the electron supply layer (upper electron supply layer; upper barrier layer) 23, the etching stop layer 19, and the cap layer 20 are sequentially stacked. The lower electron supply layer 23Y may be configured to have a structure in which the InAlAs barrier layer 12Y, an AlSb layer 15Y, a Te δ-doping layer 16Y, an AlSb layer 17Y, and an InAlAs spacer layer 14Y are sequentially stacked. The upper electron supply layer 23 may be configured to have a structure in which the InAlAs spacer layer 14, the AlSb layer 15, the Te δ-doping layer 16, the AlSb layer 17, and the InAlAs barrier layer 18 are sequentially stacked. In this manner, the semiconductor device may be configured to include a semiconductor multi-layer structure in which at least an electron traveling layer, an upper electron supply layer coming into contact with the upper side of the electron traveling layer, and a lower electron supply layer coming into contact with the lower side of the electron traveling layer are provided on a substrate. In addition, the upper electron supply layer and the lower electron supply layer may be configured to include a first portion which contains Sb and has at least a portion doped with Te and a second portion which is located closer to the electron traveling layer side than the first portion and has a lattice constant smaller than that of the first portion. In this case, each of the upper and lower electron supply layer is subjected to Te δ-doping, and thus Te δ-doping is performed twice as a whole. This will be referred to as a fourth modification example.

Figure 23:
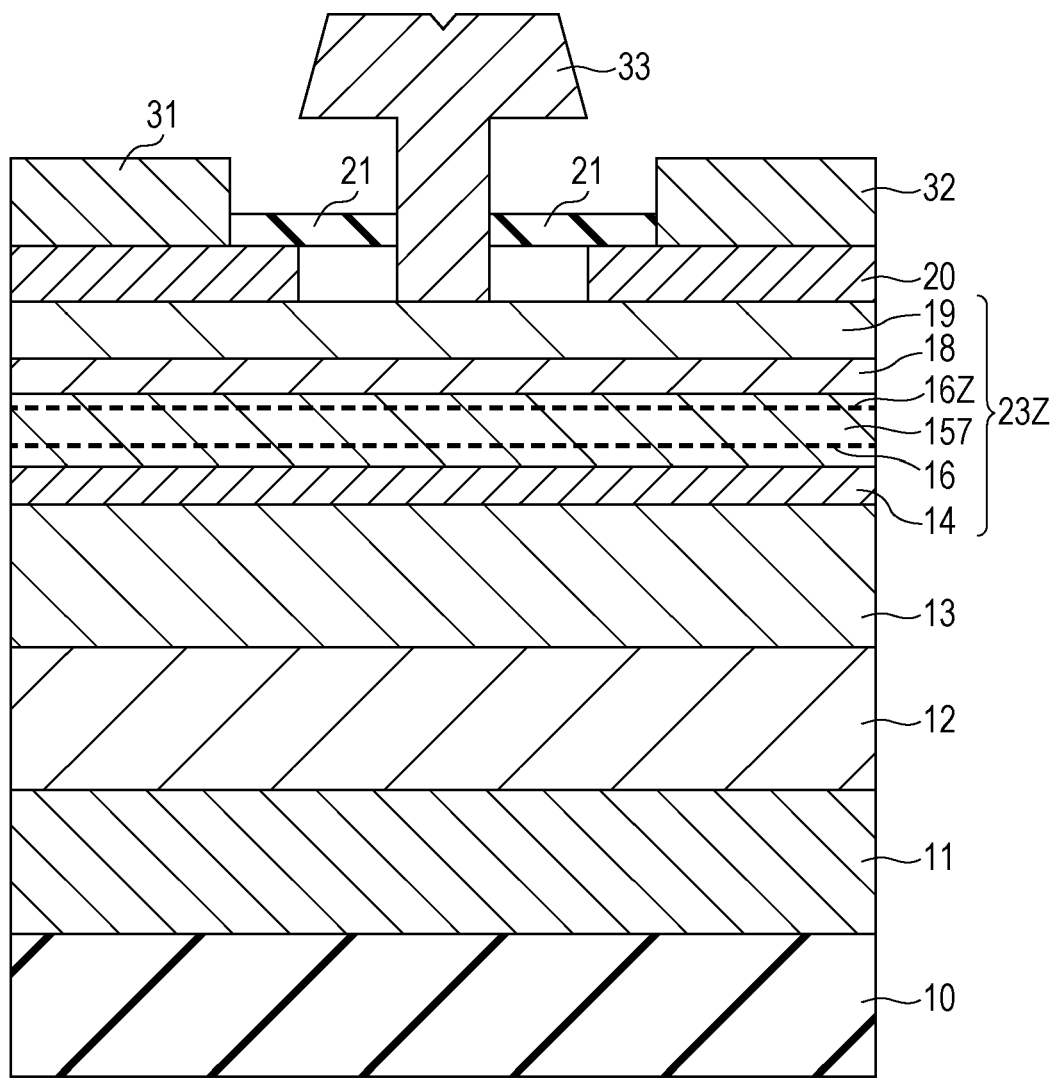
FIG. 23 is a schematic cross-sectional view illustrating the configuration of a semiconductor device (InAlAs/InGaAs-based HEMT; InP-based HEMT) according to a fifth modification example of this embodiment.

In the above-described embodiment, a description has been given of an example in which the Te δ-doping layer is provided at only one location of the AlSb layer (III-Sb-based semiconductor layer) included in the electron supply layer, but the present disclosure is not limited thereto. For example, the Te δ-doping layer may be provided at two or more locations. For example, as illustrated in FIG. 23, Te δ-doping layers 16 and 16Z may be provided at two locations in an AlSb layer 157 (III-Sb-based semiconductor layer) which is included in an electron supply layer (upper barrier layer) 23Z. In this case, an upper barrier layer 23Z is subjected to Te δ-doping twice. Meanwhile, in the first to fourth modification examples, the Te δ-doping layer may be provided at two or more locations in the AlSb layer (III-Sb-based semiconductor layer) which is included in the electron supply layer. In this manner, the first portion may be configured to include a plurality of planar doped portions. This will be referred to as a fifth modification example.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor device, comprising:
a semiconductor multi-layer structure which includes at least an electron traveling layer and an electron supply layer on a substrate,
wherein the electron supply layer includes a first portion which contains Sb and has at least a portion doped with Te, and a second portion which is located closer to the electron traveling layer side than the first portion and has a lattice constant smaller than that of the first portion,
wherein the second portion is substantially 2 nm thick, and
wherein the electron supply layer is a lower electron supply layer coming into contact with a lower side of the electron traveling layer.

2. The semiconductor device according to claim 1, wherein the first portion has a conduction band energy which is higher than that of the second portion.

3. The semiconductor device according to claim 1, wherein the electron supply layer is an upper electron supply layer coming into contact with an upper side of the electron traveling layer.

4. The semiconductor device according to claim 1, wherein the first portion includes a planar doped portion which is doped with Te in a planar shape.

5. The semiconductor device according to claim 4, wherein the first portion includes a plurality of the planar doped portions.

6. The semiconductor device according to claim 1, wherein the second portion does not contain Sb.

7. The semiconductor device according to claim 1, wherein the electron traveling layer contains InGaAs, the first portion contains Sb and a Group III element, and the second portion contains InAlAs.

8. The semiconductor device according to claim 1, wherein the electron traveling layer contains InGaAs, the first portion contains any one of AlSb, GaSb, AlGaSb, AlInSb, and AlGaInSb, and the second portion contains InAlAs.

9. The semiconductor device according to claim 1, wherein the electron traveling layer contains GaAs or InGaAs, the first portion contains Sb and a Group III element, and the second portion contains AlGaAs.

10. The semiconductor device according to any one of claim 1, wherein the electron traveling layer contains GaAs or InGaAs, the first portion contains any one of AlSb, GaSb, AlGaSb, AlInSb, and AlGaInSb, and the second portion contains AlGaAs.

11. A semiconductor device, comprising:
a semiconductor multi-layer structure which includes at least an electron traveling layer and an electron supply layer on a substrate,
wherein the electron supply layer includes a first portion which contains Sb and has at least a portion doped with Te, and a second portion which is located closer to the electron traveling layer side than the first portion and has a lattice constant smaller than that of the first portion, wherein the second portion is substantially 2 nm thick, and
wherein the electron supply layer is an upper electron supply layer coming into contact with an upper side of the electron traveling layer and is a lower electron supply layer coming into contact with a lower side of the electron traveling layer.

\* \* \* \* \*